US007503026B2

(12) United States Patent
Ichiryu et al.

(10) Patent No.: US 7,503,026 B2
(45) Date of Patent: Mar. 10, 2009

(54) CELL, STANDARD CELL, STANDARD CELL LIBRARY, A PLACEMENT METHOD USING STANDARD CELL, AND A SEMICONDUCTOR INTEGRATED CIRCUIT

(75) Inventors: Miwa Ichiryu, Hirakata (JP); Toshiyuki Moriwaki, Sakai (JP); Tetsurou Toubou, Nishinomiya (JP)

(73) Assignee: Panasonic Corporation, Osaka (JP)

( * ) Notice: Subject to any disclaimer, the term of this patent is extended or adjusted under 35 U.S.C. 154(b) by 407 days.

(21) Appl. No.: 11/305,191

(22) Filed: Dec. 19, 2005

(65) Prior Publication Data

US 2006/0136848 A1    Jun. 22, 2006

(30) Foreign Application Priority Data

Dec. 20, 2004  (JP)  ............................. 2004-367717
Jun. 30, 2005  (JP)  ............................. 2005-191434
Dec. 7, 2005   (JP)  ............................. 2005-353654

(51) Int. Cl.
    *G06F 17/50* (2006.01)
(52) U.S. Cl. ................................. 716/14; 716/9; 716/11
(58) Field of Classification Search .................... 716/9, 716/11, 14
    See application file for complete search history.

(56) References Cited

U.S. PATENT DOCUMENTS

| | | | |
|---|---|---|---|
| 4,412,240 A | 10/1983 | Kikuchi et al. | |
| 5,168,342 A | 12/1992 | Shibata | |
| 5,369,046 A | 11/1994 | Hashimoto et al. | |
| 5,448,088 A | 9/1995 | Nagai et al. | |
| 5,847,421 A | 12/1998 | Yamaguchi | |
| 5,977,574 A * | 11/1999 | Schmitt et al. | 257/207 |
| 6,084,256 A | 7/2000 | Nakata | |
| 6,194,252 B1 | 2/2001 | Yamaguchi | |
| 6,207,479 B1 | 3/2001 | Liew et al. | |
| 6,252,427 B1 | 6/2001 | Domae et al. | |

(Continued)

FOREIGN PATENT DOCUMENTS

JP    61-44444 A    3/1986

(Continued)

OTHER PUBLICATIONS

Chinese Office Action (and English Translation thereof) issued in Chinese Patent Application No. CN 200510132639.6, dated Feb. 1, 2008.

*Primary Examiner*—Thuan Do
(74) *Attorney, Agent, or Firm*—McDermott Will & Emery LLP

(57) ABSTRACT

A cell according to the present invention comprises a plurality of terminals capable of transmitting an input signal or an output signal and serving as a minimum unit in designing a semiconductor integrated circuit, wherein the plurality of terminals is located on routing grids lined in a Y direction which is a direction vertical to a power-supply wiring of the cell used in automatic placement & routing and has a shape extended in an X direction which is a direction in parallel with the power-supply wiring, more specifically such a shape that, for example, a longer-side dimension of the terminal is equal to "a routing grid interval in the X direction+a wiring width. According to the constitution, a cell area is reduced, which advantageously leads to the reduction of a chip area.

32 Claims, 18 Drawing Sheets

U.S. PATENT DOCUMENTS

| | | |
|---|---|---|
| 6,635,935 B2 | 10/2003 | Makino |
| 6,787,823 B2 | 9/2004 | Shibutani |
| 6,897,496 B2 | 5/2005 | Yamada et al. |
| 2002/0014899 A1* | 2/2002 | Sasaki et al. ............... 326/101 |
| 2002/0087940 A1* | 7/2002 | Greidinger et al. ............ 716/2 |

FOREIGN PATENT DOCUMENTS

| | | |
|---|---|---|
| JP | 62-47148 A | 2/1987 |
| JP | 3-205849 A | 9/1991 |
| JP | 5-136356 A | 6/1993 |
| JP | 9-289251 A | 11/1997 |
| JP | 10-32253 A | 2/1998 |
| JP | 10-41398 A | 2/1998 |
| JP | 2002-26125 A | 1/2002 |
| JP | 2004-55823 A | 2/2004 |

* cited by examiner

F I G. 10
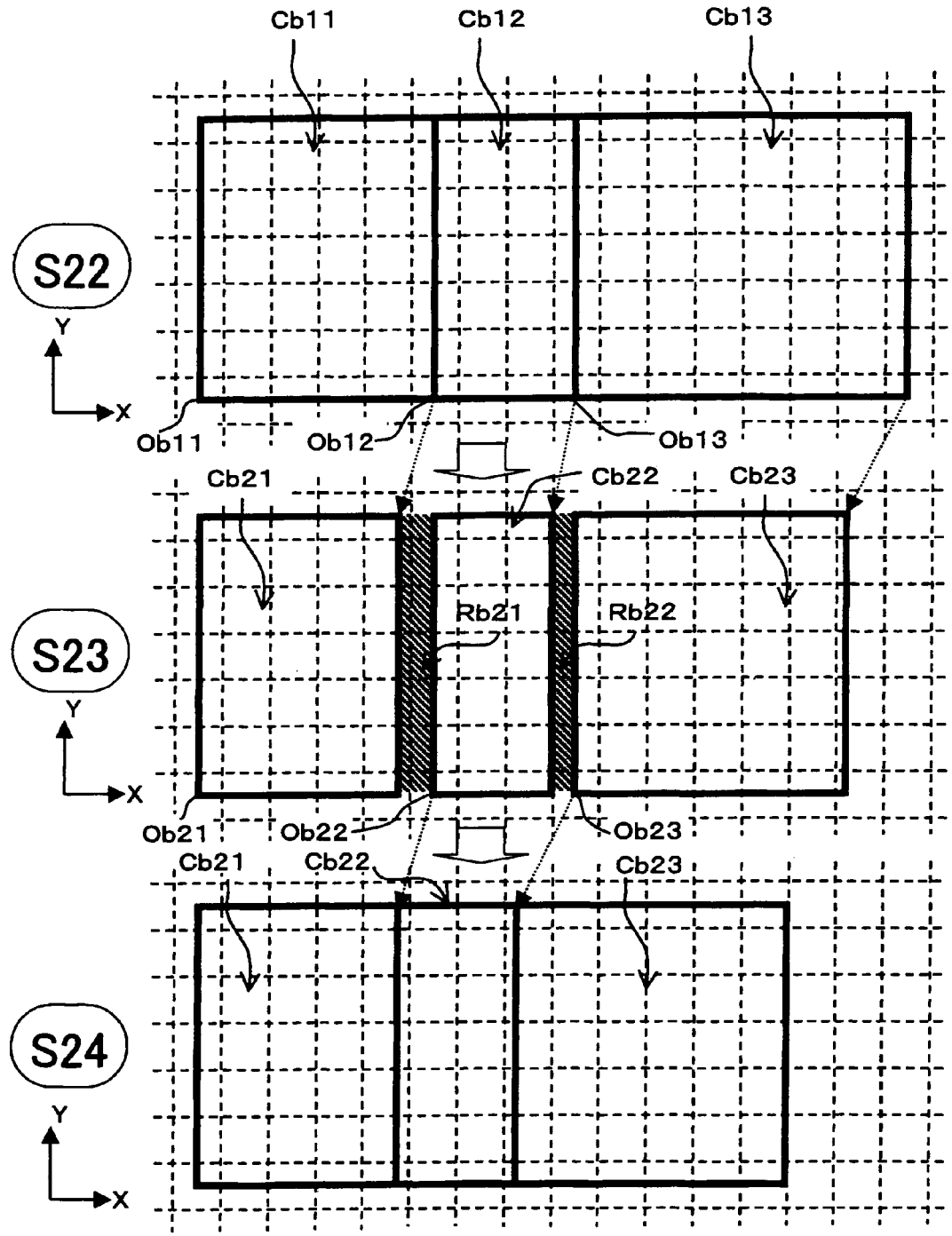

F I G. 13
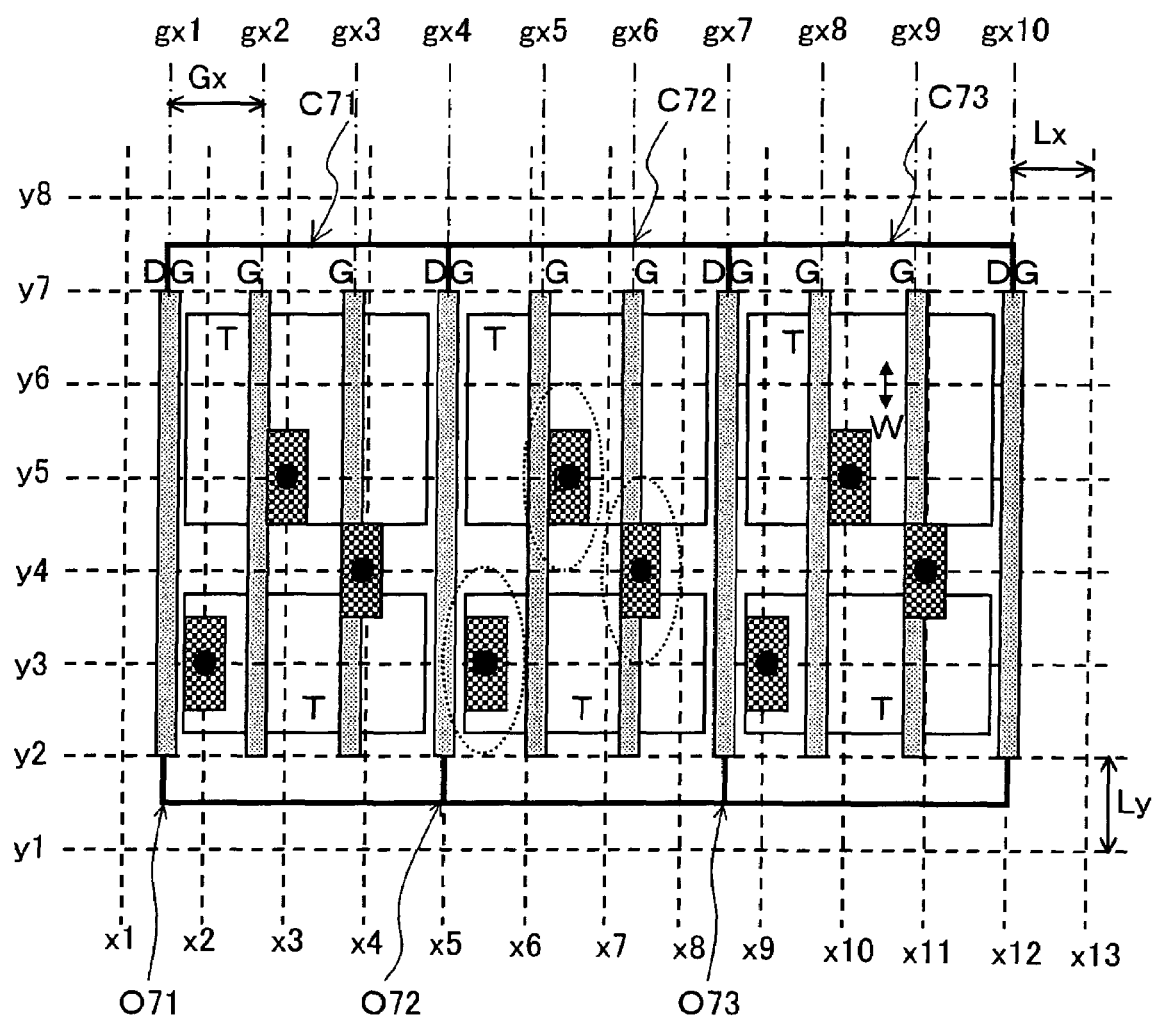

F I G. 18
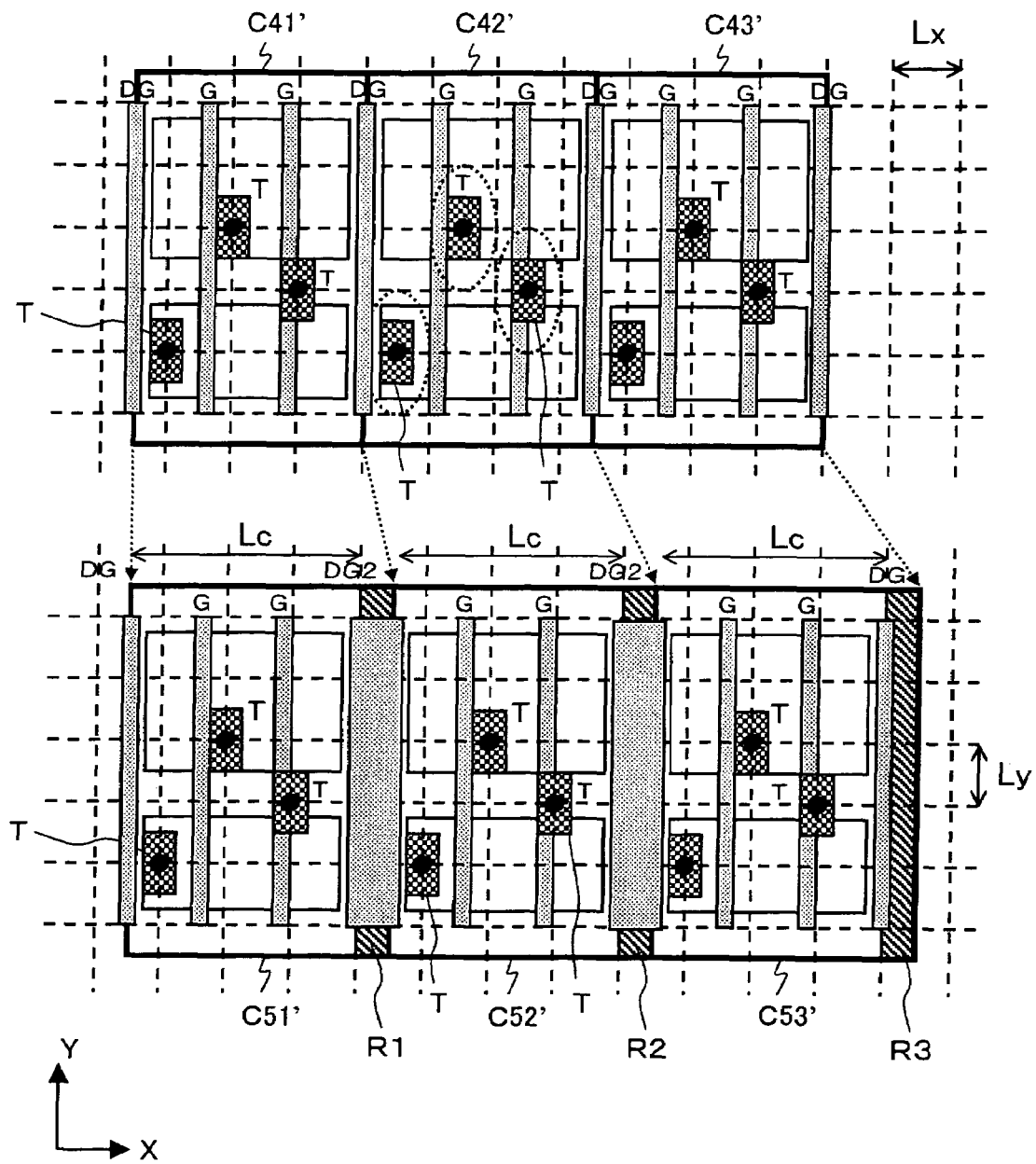

CELL, STANDARD CELL, STANDARD CELL LIBRARY, A PLACEMENT METHOD USING STANDARD CELL, AND A SEMICONDUCTOR INTEGRATED CIRCUIT

BACKGROUND OF THE INVENTION

1. Field of the Invention

The present invention relates to a standard cell, a standard cell library and a placement method of standard cells for higher integration and area reduction.

2. Description of the Related Art

In the layout design of LSI using an automatic placement & routing tool with on-grid design scheme, terminals of a cell for the communication of input/output signals must be located at the intersections of routing grids in the X and Y directions. In order to satisfy the demand, it is necessary to set a height of the cell to an integral multiple of an interval between the routing grids lined in the Y direction and to set a width of the cell an integral multiple of an interval between the routing grids lined in the X direction. Otherwise, the terminals may not locate at the grid intersection when the cells are placed adjacently with no spacing therebetween. The X direction denotes a direction along a power-supply routing of a standard cell, while the Y direction denotes a direction vertical to the power-supply routing.

According to a conventional method of designing the standard cell recited in No. 61-44444 of the Publication of the Unexamined Japanese Patent Applications, the height and the width of the cell are respectively set to an integral multiple of the interval between the routing grids so that the terminals can always locate at the grid intersection when the cells are placed adjacently with no spacing therebetween. And, the automatic placement & routing tool decide the location of the cells so that their terminals are located at the grid intersection. Then, the automatic placement & routing tool determines the position at which the cell is placed so that the position of the terminal is located at the routing grid intersection.

FIG. 17 is a layout of a standard cell according to a conventional technology. In FIG. 17, C41, C42 and C43 denote a standard cell, T denotes a terminal capable of communicating an input signal or an output signal in the standard cell, and G denotes a gate electrode. The gate electrode G extends in the Y direction because the power-supply wiring is provided in the X direction. FIG. 17 shows that the terminals T cannot locate at the grid intersection when a cell width Lc along the X direction is not an integral multiple of a routing grid interval Lx in the X direction.

None of the widths of the cells C41, C42 and C43 disposed on the upper side in FIG. 17 is the integral multiple of the routing grid interval Lx in the X direction. In the foregoing example, the cells C41, C42 and C43 are identical in order to simplify the description. The terminals T of the cells C41 and C43 locate at the grid intersection, while the terminals T of the cell C42 do not. In other words, the terminals T of the cell C42 fail to be connected in the automatic placement & routing design. In order to avoid the failure, as a general countermeasure, regions R1, R2 and R3 are provided to adjust the cell width to the integral multiple of the routing grid interval in the same manner as cells C51, C52 and C53 disposed on the lower side in FIG. 17. As a result of the adjustment, origins O51, O52 and O53 of the cells C51, C52 and C53 locate at midpoints between the routing grids adjacent to one another along both of the X and Y directions. Accordingly, all of the terminals T can locate at the grid intersection.

However, the regions R1, R2 and R3, which are only provided exclusively for the adjustment in the conventional technology, are normally unnecessary and do not include any device required for a circuit such as a transistor and wiring. As a result, a cell area increases, which is one of the factors obstructing the area reduction of LSI.

Further, in the conventional technology, each cell is placed based on the routing grid in performing the automatic placement in the automatic placement & routing tool with the on-grid design scheme. Therefore, when the cell width is not the integral multiple of the routing grid as in the cells C41, C42 and C43 shown on the upper side in FIG. 17, the cells cannot be placed adjacently with no spacing therebetween as shown on the upper side in FIG. 17. In the automatic placement, the cells are actually placed as shown on the lower side in FIG. 17. Because the cells C41, C42 and C43 are identical in the example shown in FIG. 17, it may be possible to use the widths of the cells C41, C42 and C43 as placement grid in the automatic placement and place the cells shown on the upper side in FIG. 17 in the automatic placement based on the placement grids. However, the automatic placement in the foregoing manner cannot be applied when a plurality of cells to be placed include non-identical cells and are designed so that their widths are arbitrary.

Further, as the miniaturization of the process, a precision in a finished dimension of the gate electrode ultimately obtained is deteriorated by an optical proximity effect when an interval between the gate electrodes and gate lengths of the gate electrodes are irregular in their patterns. When the precision in the finished dimension of the gate electrode is deteriorated, performances of respective transistors of the semiconductor integrated circuit are increasingly inconstant, which leads to an increased variation in a performance of the semiconductor integrate circuit. As a result, a yield ratio is decreased.

In order to solve aforementioned problems, The OPC (optical proximity effect correction) has been widely adopted in each transistor as a conventional technology, however, it takes a larger amount of time to process the OPC in each transistor. Therefore, as recited in No. H10-32253 of the Publication of the Unexamined Japanese Patent Applications, the interval and the length of the gate electrodes in each standard cell are set regular so that the OPC is processed per standard cell in the conventional technology.

FIG. 18 shows a result of the application of the foregoing conventional technology to the standard cell shown in FIG. 17. Like components in FIGS. 17 and 18 are provided with like references. Dummy gate electrodes DG are provided on cell boundaries of standard cells C41', C41' and C43' disposed on the upper side in FIG. 18. These dummy gate electrodes DG are shared between the adjacent standard cells. The gate electrodes G and the dummy gate electrodes DG are respectively equally spaced, and their gate their lengths are equal. Accordingly, the gate electrode pattern, gate length and gate interval (in particular, gate electrode pattern) are regular, not only inside the cell, but also between the cells. In the case of the standard cells C41', C41' and C43' on the upper side in FIG. 18, the pattern of the gate electrode, gate length and gate interval (in particular, the pattern of the gate electrode) are regular not only inside each of the cells but also between the cells. As a result, the precision in the finished dimension of the gate electrode can be improved.

There is no difference between the patterns of the gate length and the gate interval in the case of a single standard cell and in the case of placing the standard cells adjacent to one another. Accordingly, the OPC can be processed in each standard cell.

The OPC can be processed in each of the standard cells C41, C42 and C43 disposed on the upper side in FIG. 17 where the dummy gate electrodes DG are not provided because a distance from the cell boundary of each standard cell to the gate electrode in the closest vicinity and a distance from the cell boundary of an adjacent standard cell to the gate electrode in the closest vicinity can be constant when the distance from the cell boundary of each standard cell to the gate electrode in the closest vicinity is constant.

However, as described, when the regions R1, R2 and R3 for adjusting the cell width to the integral multiple of the routing grid interval are provided, the gate electrode located on the cell boundary of the standard cell cannot be shared. There is a possibility that the dummy electrodes DG are located with less than a minimum interval allowed in a design rule therebetween, which results in an error in the design rule. In order to avoid the foregoing error in the design rule, it is necessary to enlarge the gate length, for example, in the same manner as the dummy gate DG2 disposed on the lower side in FIG. 18.

Though the gate interval in each standard cell can be maintained at the constant level when such the gate length enlargement is executed, the gate length becomes irregular at the dummy gate electrodes DG2, which results in the imprecision of the finished dimension of the gate electrodes. Further, the OPC cannot be processed in each standard cell due to the different gate lengths in the dummy gate electrodes DG in each standard cell and the dummy gate electrodes DG2 adjacent thereto. As a result, the OPC has to be processed with respect to the entire semiconductor integrated circuit.

When the regions R1, R2 and R3 are provided, there is an disadvantage even in the standard cells C51, C52 and C53 disposed on the lower side in FIG. 17 without the dummy gate electrodes DG and DG2 though the distance from the cell boundary of each standard cell to the gate electrode in the closest vicinity in the cell is made constant. To describe the disadvantage, the cell boundary position is changed when the regions R1, R2 and R3 are provided. In that case, though the distance from the cell boundary of each standard cell to the gate electrode in the closest vicinity in the cell is made constant, the distance from the cell boundary to the gate electrode in the closest vicinity becomes inconstant. As a result, the OPC cannot be processed in each standard cell.

SUMMARY OF THE INVENTION

Therefore, a main object of the present invention is to provide a semiconductor integrated circuit capable of reducing a cell area and a chip area.

Another main object of the present invention is to provide a semiconductor integrated circuit capable of improving a precision in a finished dimension of a gate electrode despite a process miniaturization and processing the OPC in each standard cell.

In order to achieve the foregoing objects, a standard cell according to the present invention is a cell comprising a plurality of terminals capable of transmitting an input signal or an output signal and serving as a minimum unit in designing the semiconductor integrated circuit, wherein the plurality of terminals is located on routing grids lined in a Y direction which is a direction vertical to a power-supply wiring of the cell used in automatic placement & routing and has a shape extended along an X direction which is a direction in parallel with the power-supply wiring.

As a preferred mode, the shorter-side dimension of the terminal corresponds to the wiring width in the automatic placement & routing, and the longer-side dimension of the terminal is at least "the routing grid interval along the X direction+the wiring width" and at most the length obtained by subtracting the minimum wiring interval from the cell width of the cell along the X direction.

As another preferred mode, the shorter-side dimension of the terminal corresponds to the wiring width in the automatic placement & routing, and the longer-side dimension of the terminal is equal to "the routing grid interval along the X direction+the wiring width".

A preferred embodiment 1 of the present invention, which will be described later, can be referenced to describe the foregoing constitutions of the present invention.

According to the preferred modes, when a Y coordinate of a cell origin is located at a routing grid midpoint, the terminal can be located at not less than one grid intersection regardless of an X coordinate of the cell origin. In other words, it becomes unnecessary for the X coordinate of each cell origin to be at the routing grid midpoint in the X direction. Accordingly, it becomes unnecessary to provide any additional region in the cell in order to locate all of the terminals on the routing grids or to generate any useless region between the cells. As a result, the chip area can be reduced.

The dimension of the terminal may correspond to the wiring width in the automatic placement & routing in its shorter-side dimension, and the longer-side dimension thereof maybe obtained by subtracting the minimum wring interval from the cell width of the standard cell along the X direction. In that case, a standard cell placement method comprises a step of placing the standard cell, a step of providing a tentative routing for the placed standard cell in accordance with a connection information, and a step of removing any part unnecessary for the wirings from the layout of the terminals included in the standard cell. A preferred embodiment 4 of the present invention, which will be described later, can be referenced to describe the constitution.

According to the foregoing constitution, it becomes unnecessary to set the X coordinate of the cell origin to the routing grid midpoint in the X direction in order to locate all of the terminals on the routing grids. Therefore, it becomes unnecessary to provide any additional region in the cell in order to locate all of the terminals on the routing grids or to generate any useless region between the cells. As a result, the chip area can be reduced. Further, a routing resource is increased as a result of the area reduction of the terminals, and the increased routing resource can be maximally utilized in the routing process between the standard cells. Therefore, an entire wiring length can be reduced, as a result of which the reduction of a wiring capacitance, the reduction of a delay time, and the reduction of a design TAT (turn around time) because of the increased routing resource can be expected.

According to the present invention, a standard cell library for synthesizing a functional macro layout includes a standard cell having a cell width different to an integral multiple of the routing grid interval. A preferred embodiment 2 of the present invention, which will be described later, can be referenced to describe the constitution.

According to the foregoing constitution, it becomes unnecessary for the X coordinate of the cell origin in the cell placement to be on the routing grid or at the midpoint between the adjacent routing grids, which allows the standard cells having a minimum size to be placed without any interval therebetween. As a result, an area of a logic part can be reduced.

Further, a standard cell placement method according to the present invention is a design method for synthesizing a functional macro layout using the standard cell, wherein a Y coordinate of a cell origin of at least a standard cell is set to a midpoint between the adjacent routing grids or on the routing grid in the automatic placement & routing, and an X coordinate of the cell origin of the standard cell is set to the midpoint between the adjacent routing grids or to a position not on the routing grid.

The standard cell used in the foregoing constitution can employ any of the standard cells described earlier. The preferred embodiments 1-4, which will be described later, can be referenced to describe the standard cell.

According to the foregoing constitution, the X coordinate of the cell origin may not necessarily be on the routing grid or at the midpoint between the adjacent routing grids, which allows the standard cells having a minimum size to be placed without any interval therebetween. As a result, the area of the logic part can be reduced.

A standard cell placement method according to the present invention is a design method for synthesizing a functional macro layout using the standard cell, wherein the standard cell is tentatively placed, and when a Y coordinate of a cell origin of the tentatively placed standard cell is located at a midpoint between the adjacent routing grids or on the routing grid in the automatic placement & routing and an X coordinate of the cell origin is located at the midpoint between the adjacent routing grids or on the routing grid, the cell origin is moved to a position where the standard cell having the cell origin is in contact with the adjacent standard cell. The standard cell used in the foregoing constitution can employ any of the standard cells described earlier. The preferred embodiment 3, which will be described later, can be referenced to describe the standard cell.

According to the foregoing constitution, it becomes unnecessary for the X coordinate of each cell origin to be at the midpoint between the routing grids in the X direction. Therefore, the provision of any additional region in the cell becomes unnecessary in order to locate all of the terminals on the routing grids, or the generation of any useless region between the cells can be avoided. As a result, an occupied area in the design of the semiconductor integrated circuit can be reflected on the area of the logic part, which results in the reduction of the chip area.

A standard cell placement method according to the present invention is a design method for synthesizing a functional macro layout using the standard cell, wherein the standard cell is tentatively placed, and, in the case where the tentatively placed standard cell includes a first group of cells each having a cell width corresponding to an integral multiple of the routing grid interval in the automatic placement & routing, the first group of cells is replaced with a second group of cells each not necessarily having a cell width corresponding to the integral multiple of the routing grid interval.

The second group of cells can include the standard cells included in the cell library according to the present invention described earlier. The replacement method is based on the assumption that the automatic placement & routing tool is incapable of handling the cell having the cell width not necessarily corresponding to the integral multiple of the routing grid, wherein the cell origin is shifted after the replacement.

According to the foregoing constitution, a total area of the standard cells is reduced while the same logic circuit is realized. As a result, the reduction of the design TAT based on the increased routing resource can be expected.

A standard cell placement method according to the present invention comprises a step of placing a standard cell having a shorter-side dimension corresponding to a wiring width in the automatic placement & routing and a longer-side dimension obtained by subtracting a wiring minimum interval from a cell width along the X direction, a step of providing a tentative routing for the placed standard cell in accordance with a connection information of the standard cell, and a step of removing any part unnecessary part for the wirings from the layout of the terminals included in the standard cell. The preferred embodiment 4, which will be described later, can be referenced to describe this constitution.

According to the foregoing constitution, it becomes unnecessary for the X coordinate of the cell origin to be at the midpoint between the routing grids in the X direction in order to locate all of the terminals on the routing grids, which consequently makes it unnecessary to provide any additional region in the cell in order to locate all of the terminals on the routing grids, or the generation of any useless region between the cells can be avoided. As a result, the chip area can be reduced. Further, the area reduction of the terminals leads to the increase of the routing resource, and the increased routing resource can be maximized in the routing process between the standard cells. Then, an entire wiring length can be reduced, and the reduction of the wiring capacitance, the reduction of the delay time, and the reduction of the design TAT based on the increased routing resource can be expected.

The standard cell according to the present invention is a standard cell comprising a plurality of gate electrodes, wherein a cell width along the X direction in parallel with a power-supply wiring is set to an integral multiple of a numeral value different to the routing grid interval along the X direction.

A standard cell according to the present invention is a standard cell comprising a plurality of gate electrodes, wherein gate pitches of some of the gate electrodes are set to values different to the routing grid interval set along the X direction in parallel with the power-supply wiring of the standard cell, and a cell width along the X direction in parallel with the power-supply wiring of the standard cell is set to an integral multiple of a minimum value of the gate pitches of the gate electrodes set to the values different to the routing grid interval set along the X direction.

According to the foregoing constitution, the cell width is set to the integral multiple of the minimum gate pitch so that the cells can be placed based on the minimum gate pitch without any interval between them. Therefore, the chip area can be reduced, and the cells can be placed without any interval therebetween. As a result, the gate electrode pattern including a gate length and a gate interval can be regular. Then, a precision in a finished dimension of the gate electrodes can be improved, and the OPC can be processed in each standard cell.

A standard cell according to the present invention comprises a plurality of gate electrodes and a plurality of dummy gate electrodes, wherein a cell width in the X direction in parallel with the power-supply wiring of the standard cell is an integral multiple of a minimum gate pitch of gate pitches of the gate electrodes and the dummy gate electrodes different to the routing grid interval along the X direction.

According to the foregoing constitution, the cell width is the integral multiple of the minimum gate pitch so that the cells can be placed based on the minimum gate pitch without any interval between them. Therefore, the chip area can be reduced, and the cells can be placed without any interval therebetween. As a result, the gate electrode pattern including a gate length and a gate interval can be regular. Then, the precision in the finished dimension of the gate electrodes can be improved, and the OPC can be processed in each standard cell. As another advantage, the provision of the dummy gate electrodes can further improve the regularity of the gate length and gate interval, which largely contributes to the facilitation of the OPC process in each standard cell.

The gate pitches of the standard cell are all preferably equal. Thereby, the pattern of the gate electrodes can impart a perfect regularity to the gate pitches, and the precision in the finished dimension of the gate electrodes can be further improved.

At least one of the gate lengths of the gate electrodes of the standard cell is preferably different to the other gate lengths. When the regularity is thus lost in part of the pattern of the gate electrodes, the chip area can be reduced, the precision in the finished dimension of the gate electrodes can be improved, and the OPC can be processed in each standard cell, while, at the same time, a degree of freedom in designing the standard cell is maintained.

The standard cell preferably further comprises a plurality of terminals capable of transmitting an input signal or an output signal, wherein the terminals are located on the routing grids along the Y direction vertical to the power-supply wiring of the cell used in the automatic placement & routing and has a shape extended along the X direction in parallel with the power-supply wiring.

Further, the shorter-side dimension of the terminal preferably corresponds to the wiring width in the automatic placement & routing, and the longer-side dimension of the terminal is preferably at least the routing grid interval along the X direction and at most the length obtained by subtracting the wiring minimum interval from the cell width of the cell along the X direction.

Further, the shorter-side dimension of the terminal preferably corresponds to the wiring width in the automatic placement & routing, and the longer-side dimension of the terminal is preferably at least "the routing grid interval along the X direction+the wiring width" and at most the length obtained by subtracting the wiring minimum interval from the cell width of the cell along the X direction.

Further, the shorter-side dimension of the terminal preferably corresponds to the wiring width in the automatic placement & routing, and the longer-side dimension of the terminal preferably corresponds to "the routing grid interval along the X direction+the wiring width".

Accordingly, in addition to such advantages that the chip area can be reduced; the precision in the finished dimension of the gate electrodes can be improved; and the OPC can be processed in each standard cell, the terminals can be located at not less than one grid intersetion as far as the Y coordinate of the cell origin is located at the midpoint between the routing grids regardless of the X coordinate of the cell origin. To put it differently, it becomes unnecessary for the X coordinate of the cell origin to be at the midpoint between the routing grids in the X direction. Therefore, any additional region need not be provided in the cell in order to locate all of the terminals on the routing grids, or any useless region is no longer generated between the cells. As a result, the chip area can be reduced.

In the present invention, the standard cell library may comprise the foregoing standard cell. Then, the chip area can be reduced, the precision in the finished dimension of the gate electrodes can be improved, and the OPC can be processed in each standard cell when the semiconductor integrated circuit is designed.

In the present invention, the semiconductor integrated circuit may comprise the foregoing standard cell. Then, the semiconductor integrated circuit capable of reducing the chip area, improving the precision in the finished dimension of the gate electrodes and processing the OPC in each standard cell can be obtained.

A standard cell placement method according to the present invention is a design method for synthesizing a functional macro layout using a standard cell, wherein a Y coordinate of a cell origin of at least a standard cell is set to a midpoint between the adjacent routing grids or on the routing grid in the automatic placement & routing, and an X coordinate of the cell origin of the standard cell is set to a midpoint between gate pitch grids instead of the midpoint between the adjacent grids or on the gate pitch grid. The standard cell used in this constitution can adopt any standard cell described earlier.

According to the foregoing constitution, the X coordinate of the cell origin can be determined based on the gate pitch in the cell placement. This leads to the reduction of the chip area and the placement of the cells without any interval between them. As a result, the gate electrode pattern including the gate length and gate interval can be regular. Then, the precision in the finished dimension of the gate electrodes can be improved, and the OPC can be processed in each standard cell.

As described, according to the present invention, any additional region need not be provided in the cell in order to locate all of the terminals on the routing grids, or any useless region is no longer generated between the cells. As a result, the chip size can be reduced.

Further, because the pattern of the gate electrodes can have the regularity, the precision in the finished dimension of the gate electrodes can be improved, and the OPC can be performed in each standard cell.

As described so far, according to the present invention, the wiring length can be reduced. The shorter wiring length is effective for reducing the chip area, reducing the delay time in consequence of the reduction of a power-supply drop, and reducing a variation in the manufacturing process.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIG. 10 is a layout of standard cells according to the embodiment 4.

FIG. 13 is a layout relating to the embodiment 5 for describing a failure to locate the terminals at grid intersecting points.

FIG. 18 is another layout of standard cells according to the conventional technology.

DETAILED DESCRIPTION OF THE INVENTION

Figure 1:
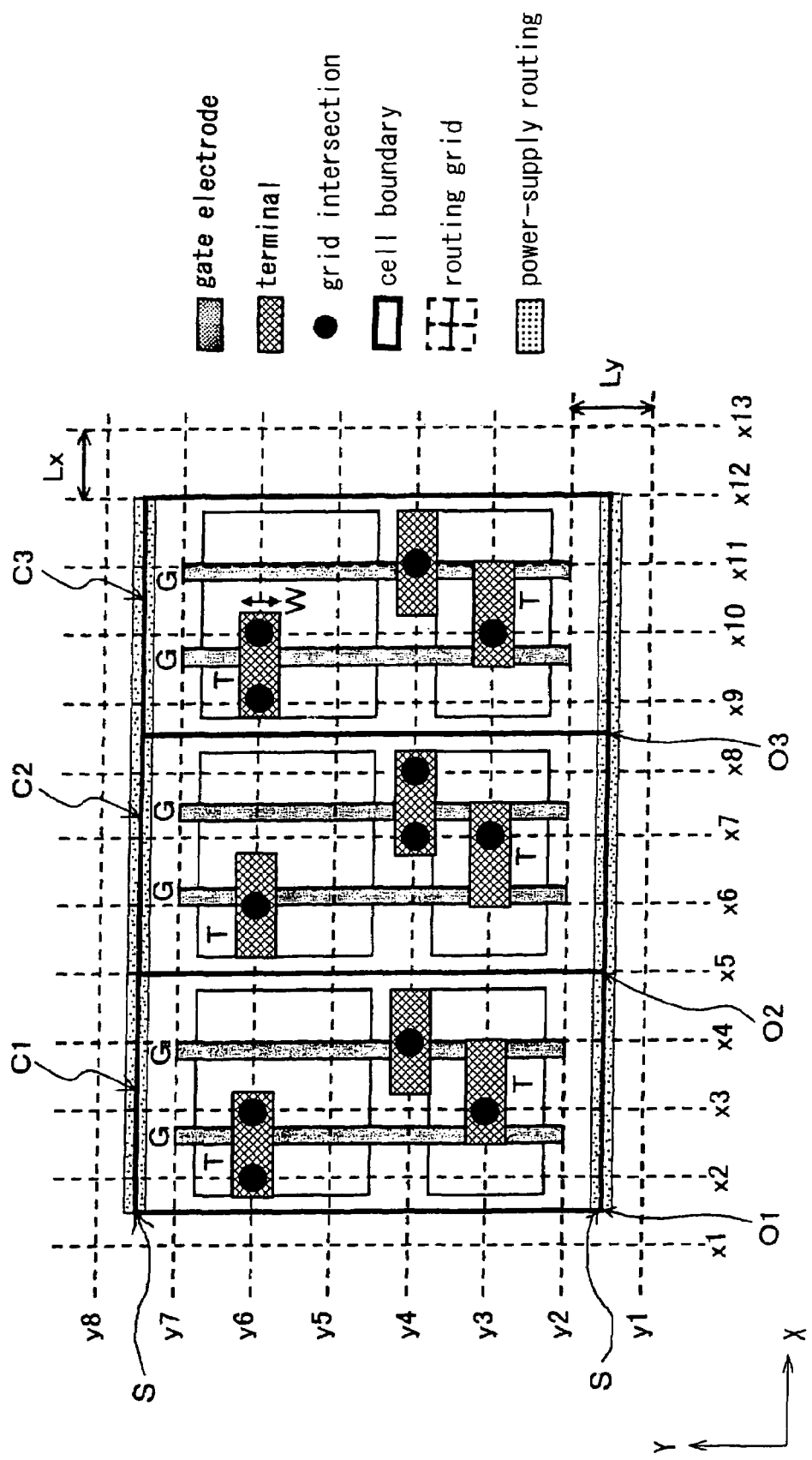
FIG. 1 is a layout of standard cells according to an embodiment 1 of the present invention.

Hereinafter, preferred embodiments of a standard cell placement method according to the present invention are described referring to the drawings.

EMBODIMENT 1

FIG. 1 is a layout of standard cells according to an embodiment 1 of the present invention. A direction along a power-supply wiring S of the standard cell is referred to as X direction, while a direction vertical to the power-supply wiring S is referred to as Y direction. The power-supply wiring S is merely an example, and is not necessarily allocated as shown.

Referring to reference symbols in FIG. 1, x1-x13 denote routing grids used in automatic placement & routing and provided in the X direction, y1-y8 denote routing grids provided in the Y direction, C1, C2 and C3 denote standard cells, O1, O2 and O3 are respectively origins of C1, C2 and C3, T denotes a terminal capable of transmitting an input signal or an output signal of a standard cell Ci (i=1, 2, . . . ), and G denotes a gate electrode.

An automatic placement & routing tool is an automatic design tool for determining the location of cells and blocks and routing path among their terminals. The automatic design tool comprises programs processed on a computer, and installed in the computer in advance and used.

When the automatic placement & routing tool is used, the wiring can be provided with a minimum wiring width on the routing grids in the X and Y directions. The routing grids for the wirings are located at the equal interval of Lx in the X direction and located at the equal interval of Ly in the Y direction. Basically, different wiring layers are respectively used for the wirings in the X direction and the wirings in the Y direction, and the different wiring layers are joined by means of an inter-layer connection.

A wiring constituting the terminal T has a rectangular shape horizontally extended along the X direction. A shorter-side dimension of the terminal T corresponds to a wiring width W in the automatic placement & routing. A longer-side dimension is at least (Lx+W), where Lx is the routing grid interval and W is the wiring width.

In order to provide the wiring connection for the terminal T using the automatic placement & routing tool, the terminal T must include the grid intersection (a point at which the routing grids intersect with each other) (see black circles). In the embodiment 1, the terminal T has the rectangular shape horizontally extended (extended in the X direction) and is located on a routing grid yi (i=1, 2, . . . ) along the Y direction.

Figure 3:
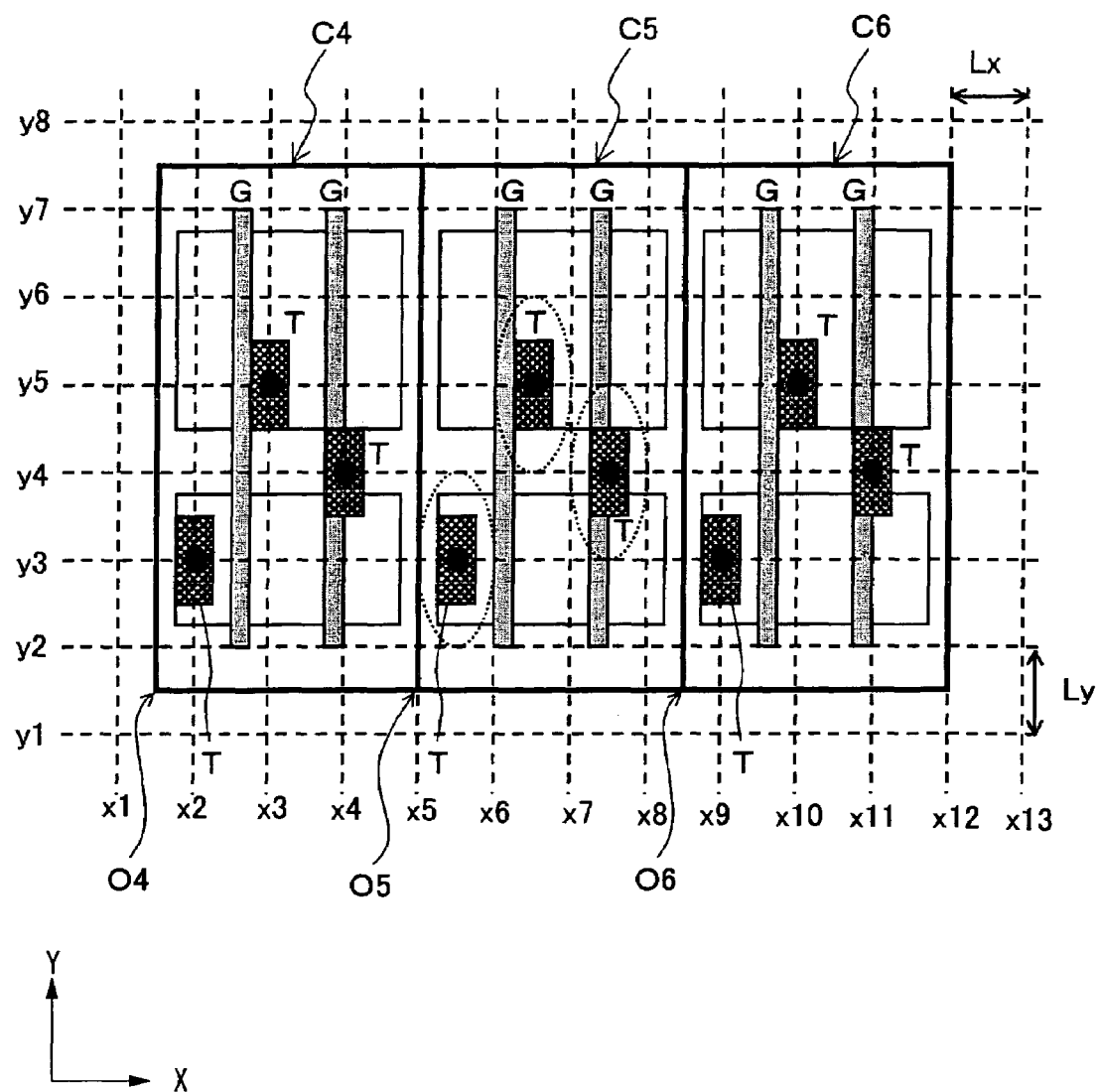
FIG. 3 is a layout relating to the embodiment 1 for describing a failure to locate the terminals at grid intersections.

On the contrary to the constitution according to the embodiment 1, when the wiring constituting the terminal T has a rectangular shape vertically extended (extended in the Y direction) as shown in FIG. 3, some of the terminals T do not locate on the grid intersection as shown by the terminal T encircled by an ellipse. This is identical to the disadvantage of the conventional technology shown in FIG. 17.

Figure 2:
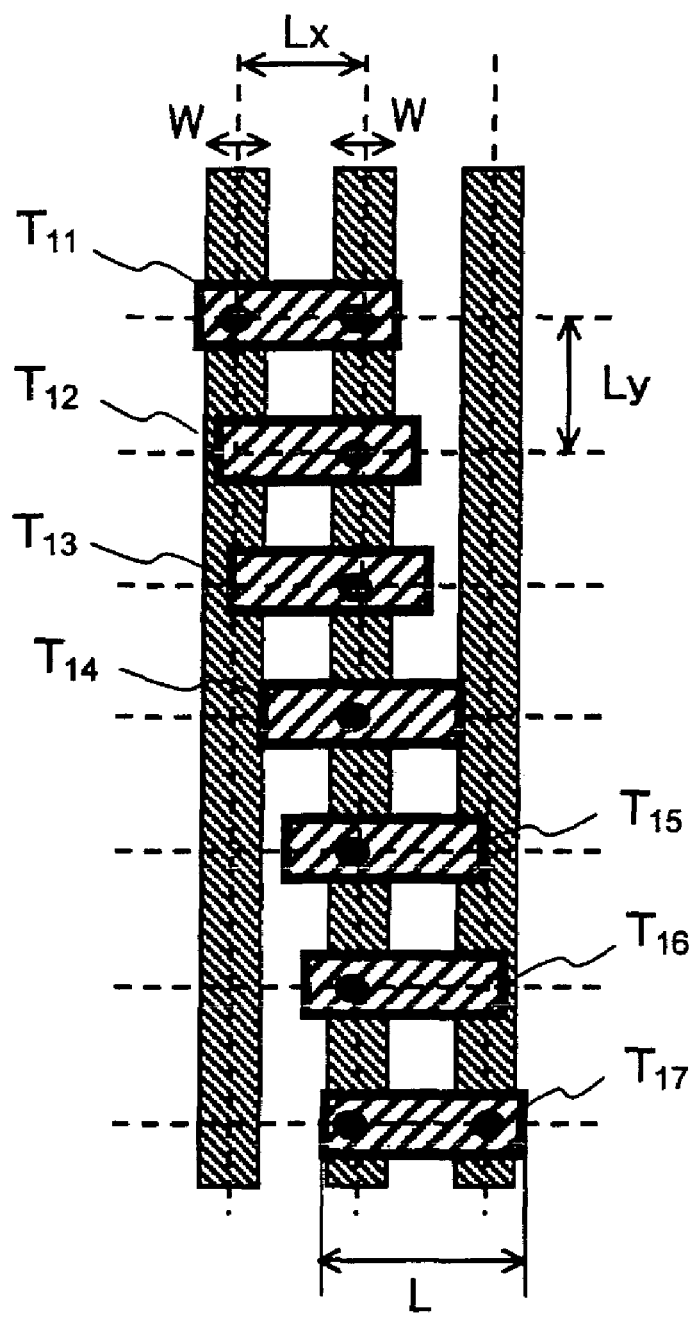
FIG. 2 is an illustration of locations of terminals according to the embodiment 1.

When the terminal T has the rectangular shape horizontally extended wherein its longer-side dimension is (Lx+W), the terminal T intersects with the intersection of the routing grids maximally at two positions as exemplified by terminals $T_{11}$ and $T_{17}$ shown in FIG. 2. Further, the terminal T intersects with at least one grid intersection exemplified by terminals $T_{12}$-$T_{16}$ even when the terminal T shifts in the X direction from the positions shown by the terminals $T_{11}$ and $T_{17}$.

According to the embodiment 1, the location of the cell is restricted in the Y direction. However, when the cell is located arbitrarily in the X direction, the terminal T can be located on at least one routing grid intersection. Therefore, it becomes unnecessary to locate the origins of the respective cells at inter-grid midpoints in the X direction as shown in the cells C51, C52 and C53 according to the conventional technology shown in FIG. 17 in order to locate all of the terminals T on the routing grids. More specifically, the additional regions R1, R2 and R3, which are provided in order to locate all of the terminals T on the routing grids, need not be provided in the cell, or the useless regions R1, R2 and R3 are no longer generated between the cells. As a result, a chip area can be reduced.

An upper-limit value of the longer-side dimension of the wiring constituting the terminal T is substantively a length obtained by subtracting a minimum wiring interval from the cell width of the cell C along the X direction. Further, as described, the longer-side dimension of the wiring constituting the terminal T is preferably set to (Lx+W) in terms of an area efficiency. However, the value of (Lx+W) may be regarded as a lower-limit value of the longer-side dimension of the wiring constituting the terminal T.

In the embodiment 1 described above, the present invention was applied to the standard cell when logic blocks are synthesized in the design. In the embodiment 1, however, the present invention can also be applied to a gate array cell in which a gate pitch is previously set. In that case, the same constitution on the drawing is obtained as far as a terminal of the gate array cell has a shape identical to that of the terminal of the standard cell. Then, the effect of reducing the cell area is obtained in the same manner as in the case of the standard cell. Alternatively, the block area can be prevented from increasing when the routing grids are extended to be equal to the gate pitch of the gate array cell.

FIG. 1 also shows a part of the semiconductor integrated circuit designed using the cell described in the embodiment 1. It is needless to say that the area of the integrated circuit can be reduced when the cell described above is used.

Figure 4:
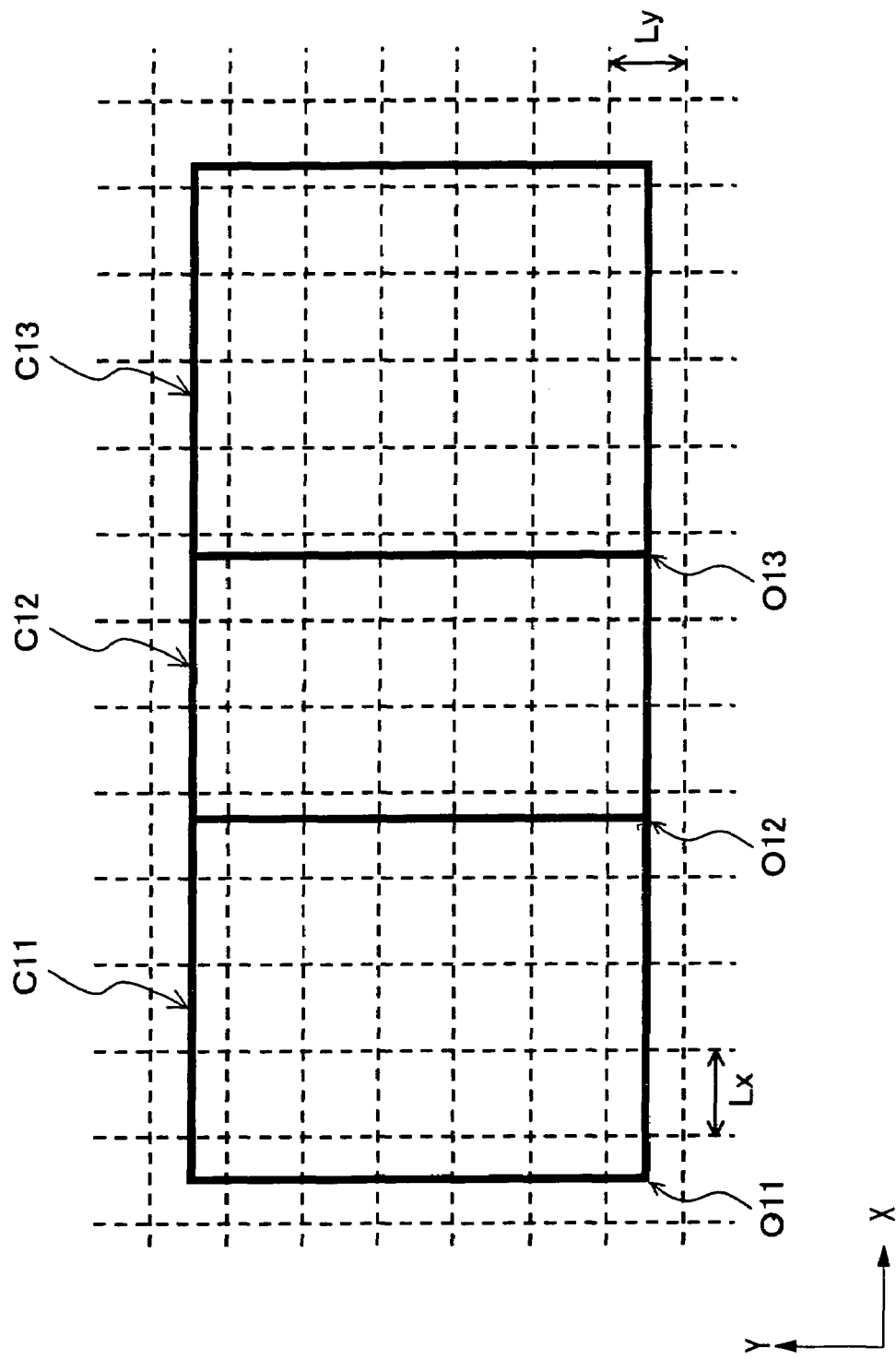
FIG. 4 is a layout of standard cells according to a modified embodiment of the embodiment 1.

As shown in FIG. 4, according to the embodiment 1, the origin of the cell having the cell width not necessarily corresponding to the integral multiple of Lx may not always be located at the midpoint between the adjacent routing grids in the X direction. The constitution shown in FIG. 4 can achieve the same effect as obtained in the embodiment 1.

EMBODIMENT 2

Figure 5:
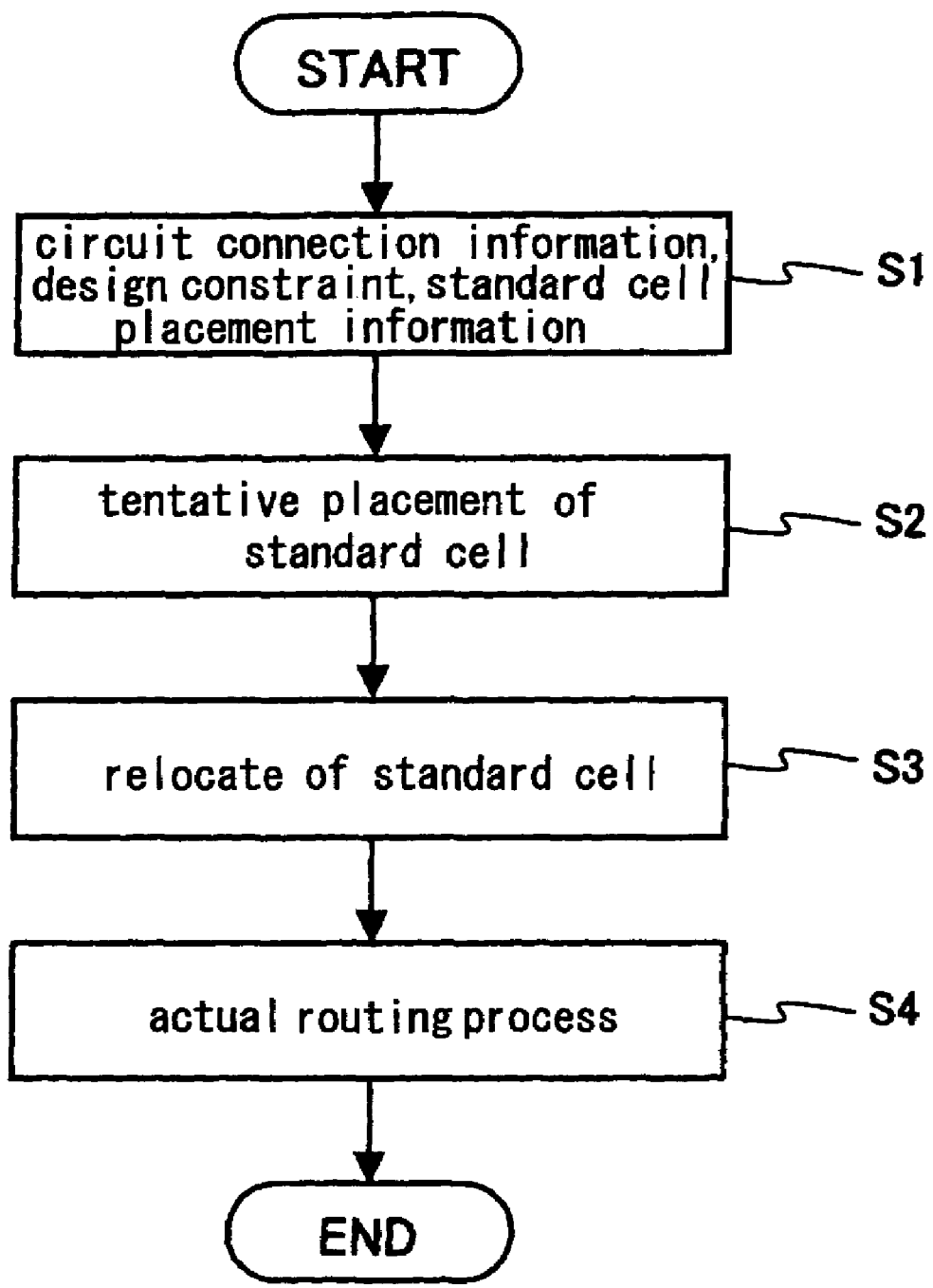
FIG. 5 is a design flow chart of an automatic placement & routing method using a standard cell according to an embodiment 2 of the present invention.

FIG. 5 is a design flow chart of an automatic placement & routing method using a standard cell according to an embodiment 2 of the present invention.

An automatic placement & routing apparatus for implementing the automatic placement & routing method comprises a connection information inputting device for acquiring a connection information of a logic circuit from outside, a design constraint inputting device for acquiring a design constraint of the logic circuit from outside, a layout information inputting device for acquiring a layout information of the standard cell from outside, a tentative placing device for tentatively placing respective cells based on the acquired connection information, and a relocating device for relocating the cells tentatively placed so as to reduce an area. The automatic placement & routing apparatus thus constituted places and routes the logic circuit including a plurality of standard cells.

First, the circuit connection information of the logic circuit for connecting the plurality of standard cells to one another, the design constraint required for the automatic placement & routing, and the layout data of the respective standard cells are previously stored in a memory device not shown. The layout information stored in the memory device refers to the layout of cells C21, C22 and C23 having the same structure as described in the embodiment 1.

Based on the foregoing arrangement, the automatic placement & routing apparatus reads the circuit connection information, design constraint and layout data of the respective standard cells from the memory device in a data reading step S1.

Figure 6:
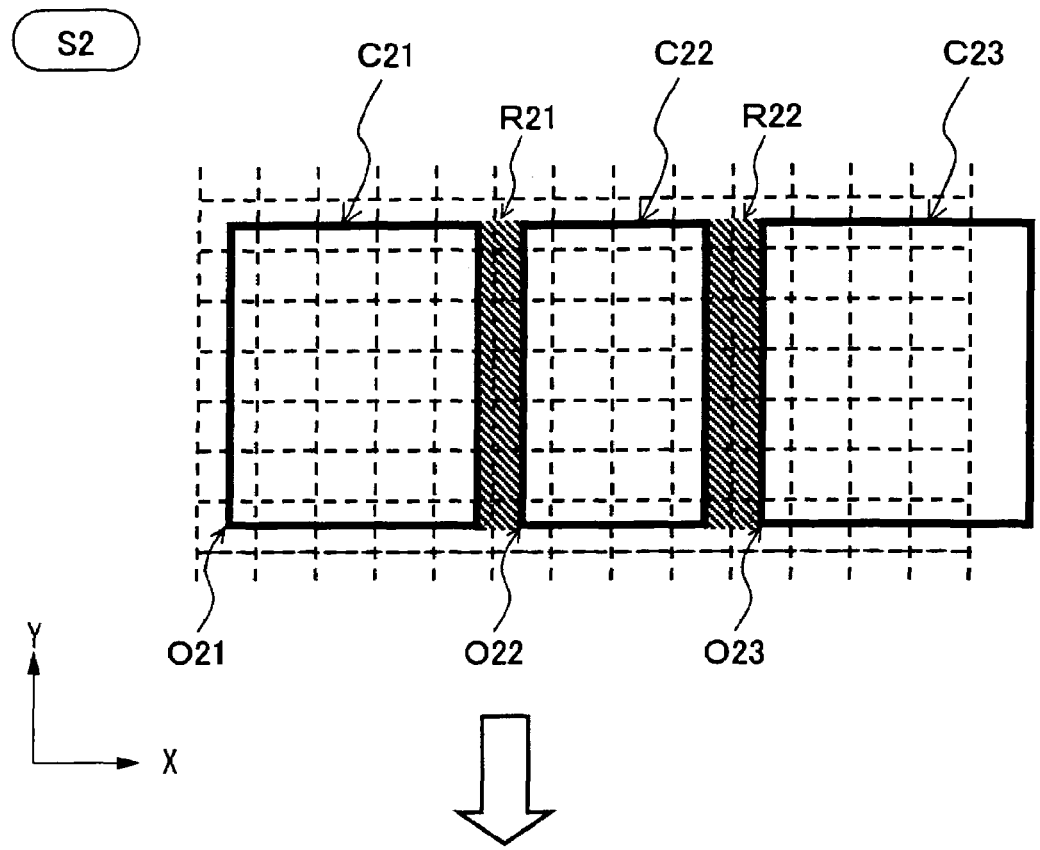
FIG. 6 is a layout of standard cells according to an embodiment 2 of the present invention.
Figure 6:
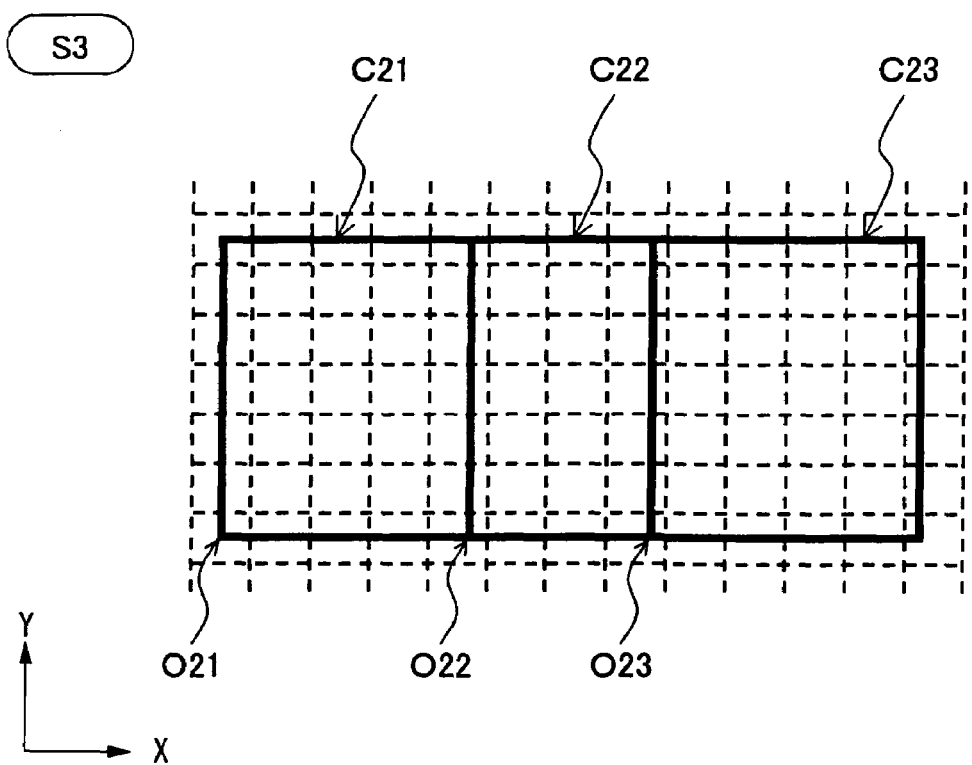

Next, as shown in FIG. 6, the automatic placement & routing tentatively places the cells C21, C22 and C23 based on the circuit connection information so that origins O21, O22 and O23 of first standard cells C21, C22 and C23 are located at the midpoints between the adjacent routing grids in the X direction and at the midpoints between the routing grids in the Y direction in a tentative placing step S2. The first standard cells C21, C22 and C23 have the structure described in the embodiment 1, and each has the cell width not necessarily corresponding to the integral multiple of the routing grid interval in the automatic placement & routing.

Next, the automatic placement & routing apparatus extracts, from the standard cell tentatively placed, the cell in which the Y coordinate of the cell origin is located at the midpoint between the adjacent routing grids or on the routing grid in the automatic placement & routing and the X coordinate of the cell origin is located at the midpoint between the adjacent routing grids or on the routing grid in a relocating step S3. In the example shown in FIG. 6, the cells C21, C22 and C23 are extracted.

Next, the automatic placement & routing apparatus, in the relocating step S3, relocates the extracted cells C21, C22 and C23 by moving them in the X direction so that the extra regions R21, R22 and R23 adjacent thereto are eliminated so that their respective cell boundaries come into contact with one another so that the area of the logic part can be reduced.

Therefore, the automatic placement & routing apparatus routes the relocated cells C21, C22, and C23 with respect one another in an actual routing processing step S4.

When the relocating step S3 is executed, the regions R21 and R22 (shaded regions) in the tentative placing step S2 can be eliminated. As a result, the logic area can be reduced, and the chip area can be reduced.

EMBODIMENT 3

Figure 7:
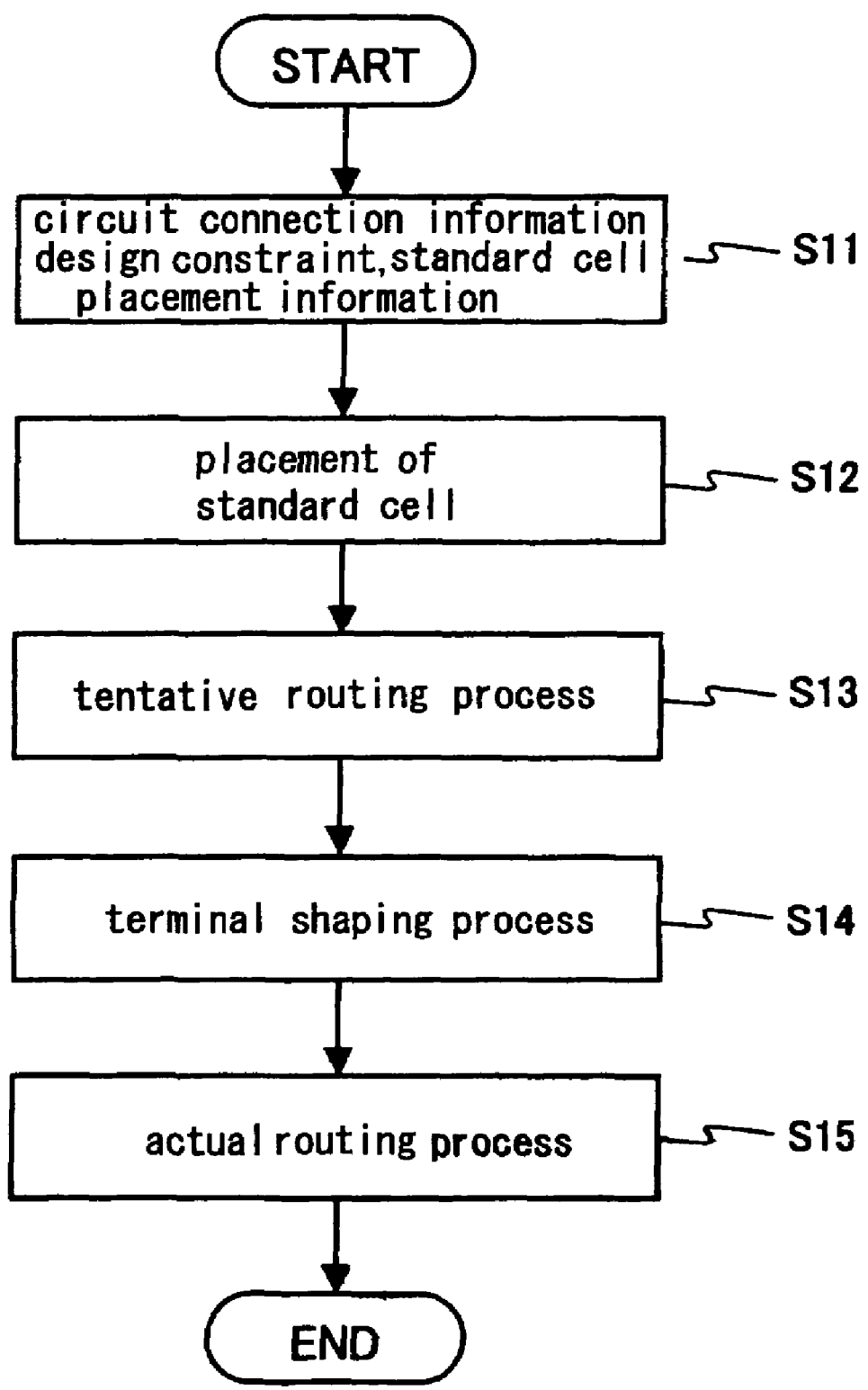
FIG. 7 is a processing flow chart of an automatic placement & routing method using a standard cell according to an embodiment 3 of the present invention.
Figure 8:
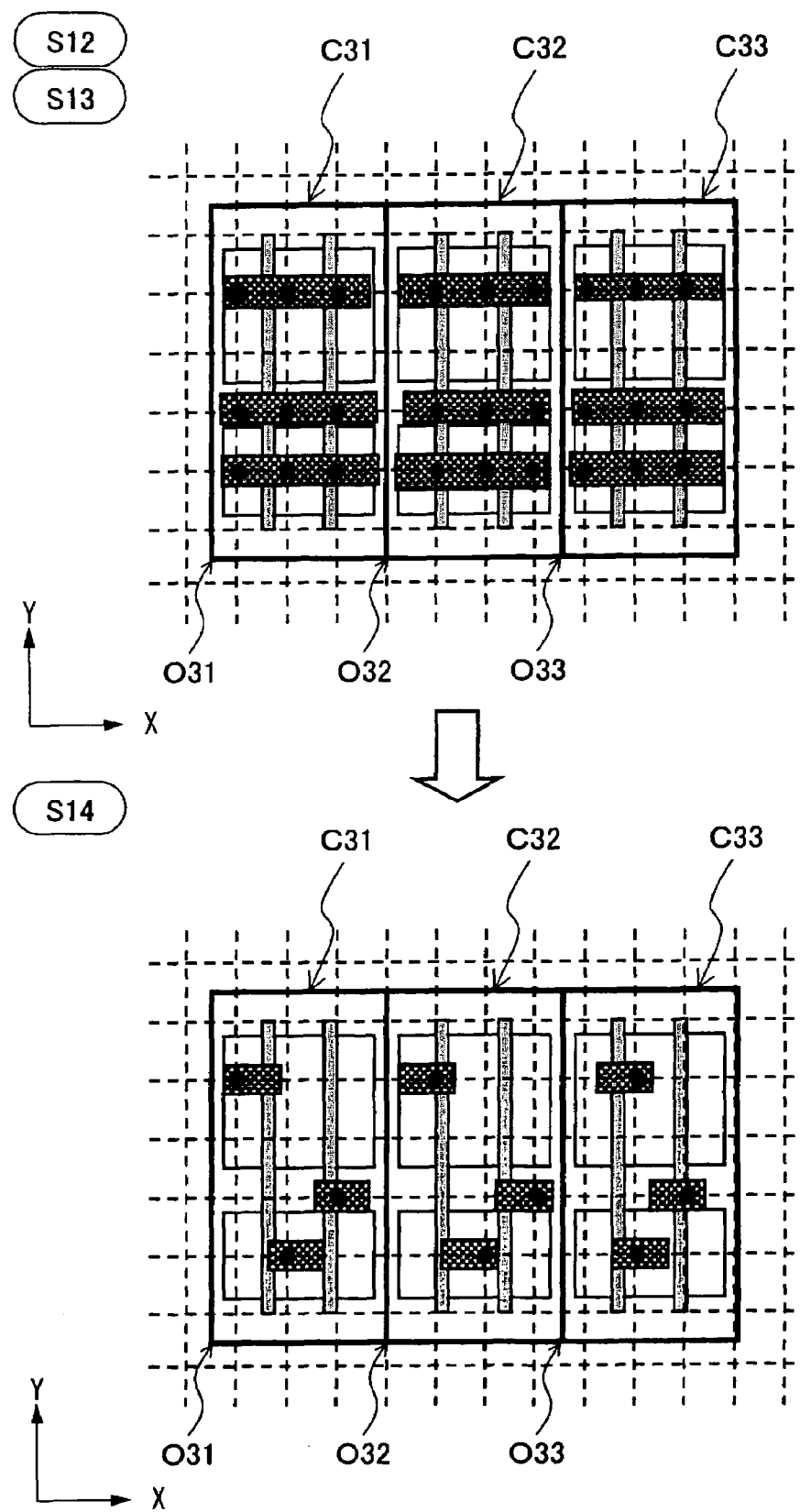
FIG. 8 is a layout of standard cells according to an embodiment 3 of the present invention.

FIG. 7 is a design flow chart of an automatic placement & routing method using a standard cell according to an embodiment 3 of the present invention.

An automatic placement & routing apparatus for implementing the automatic placement & routing method comprises a connection information inputting device for acquiring a connection information of a logic circuit from outside, a design constraint inputting device for acquiring a design constraint of the logic circuit from outside, a layout information inputting device for acquiring a layout information of the standard cell from outside, a placing device for placing cells based on the acquired connection information, a tentative routing processing device for providing a tentative routing for connecting terminals of the respective cells, a terminal shape processing device. for shaping a terminal, and an actual routing processing device.

First, the circuit connection information of the logic circuit for connecting a plurality of standard cells to one another, the design constraint required for the automatic placement & routing, and the layout data of the respective standard cells are previously stored in the memory device not shown. The layout information stored in the memory device basically has a structure similar to that of the layout information relating to the cells C11, C12 and C13 having the structure described in the embodiment 1. Details of the layout information is given below.

Based on the foregoing arrangement, the automatic placement & routing apparatus reads the circuit connection information of the logic circuit for connecting the plurality of cells to one another, the design constraint required for the automatic placement & routing and the layout data of each cell from the memory device in a data reading step S11. As mentioned earlier, the read layout data basically has the similar structure as described in the embodiment 1, the longer-side dimension of terminal T is set to the length obtained by subtracting the minimum wiring interval from the cell width along the X direction. The longer-side dimension of the terminal T will be reduced in a subsequent step. Further, the cell width is not necessarily the integral multiple of the routing grid interval in the automatic placement & routing.

Next, the automatic placement & routing apparatus places cells C31, C32 and C33 based on the circuit connection information so that cell origins O31, O32 and O33 are located at the midpoints between the adjacent routing grids in the Y direction in a standard cell placing step S12.

Next, the automatic placement & routing apparatus connects the plurality of terminals T by wrings based on the circuit connection information in a tentative routing processing step S13. Because the shape of the terminal T is extended in the X direction, a degree of freedom in the tentative routing is increased, which reduces an entire wiring length.

Thereafter, the automatic placement & routing apparatus automatically acknowledges a shape and a dimension of the terminal demanded to realize an effective connection, and removes any unnecessary part from the terminal T to thereby reduce the dimension of the terminal in a terminal shape processing step S14.

Finally, the automatic placement & routing apparatus routes the standard cells with respect to one another in an actual routing processing step S15. Because the routing resource is increased by the reduction of the terminal dimension in the terminal shape processing step S14, the standard cells are routed with respect to one another in such manner that the increased routing resource is maximally utilized.

By executing the steps S11-S15, the entire wiring length can be reduced, and the reductions of the wiring capacity and delay time and the reduction of the design TAT because of the increased routing resource can be realized.

Figure 17:
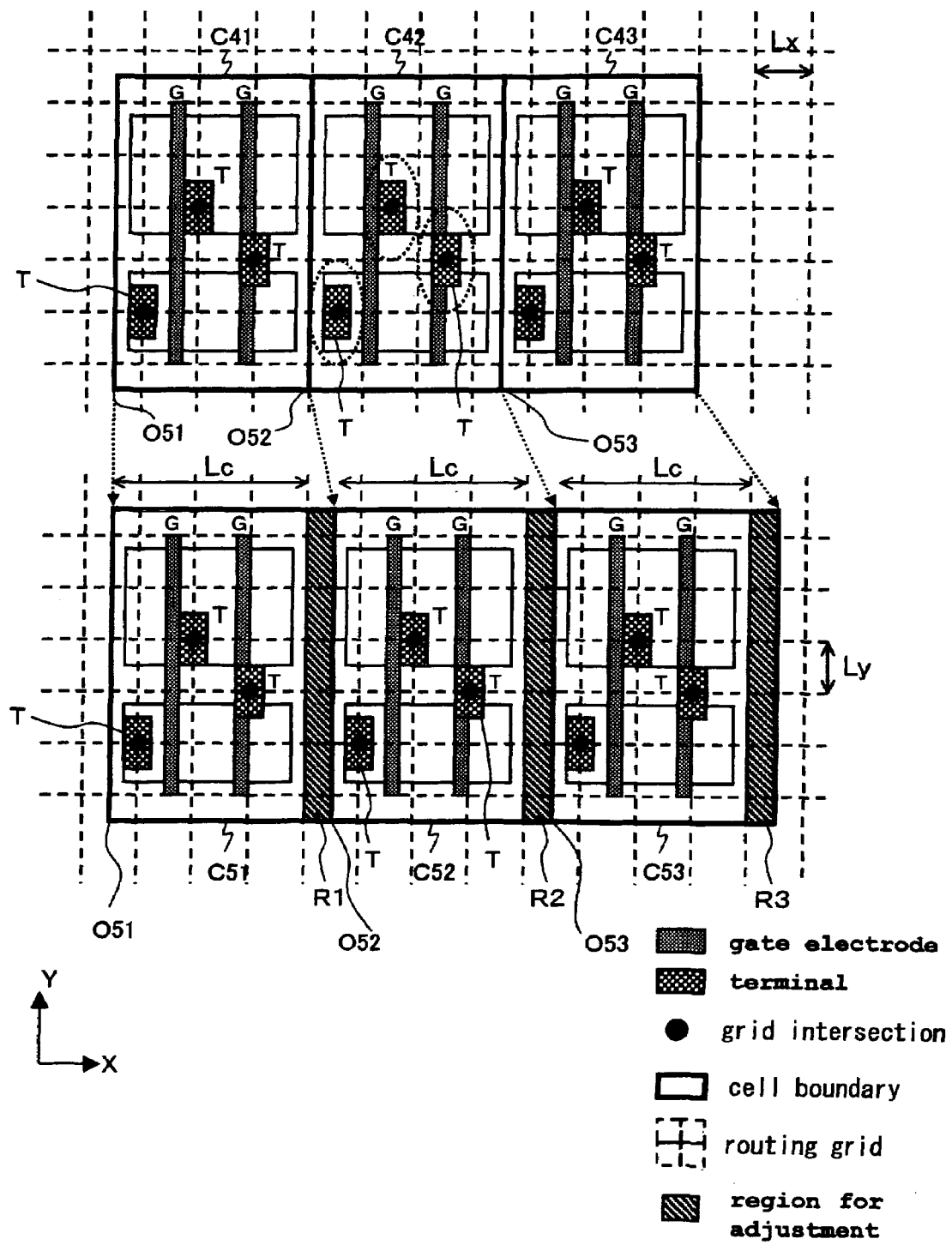
FIG. 17 is a layout of standard cells according to a conventional technology.

Further, it becomes unnecessary to locate the respective cell origins at the inter-grid midpoints in the X direction as in the cells C51, C52 and C53 according to the conventional technology shown in FIG. 17 in order to locate all of the terminals T on the routing grids. In other words, the regions R1, R2 and R3 need not be provided in the cell in order to locate all of the terminals T on the routing grids, or the regions R1, R2 and R3 are no longer generated between the cells. As a result, the chip area can be reduced.

EMBODIMENT 4

Figure 9:
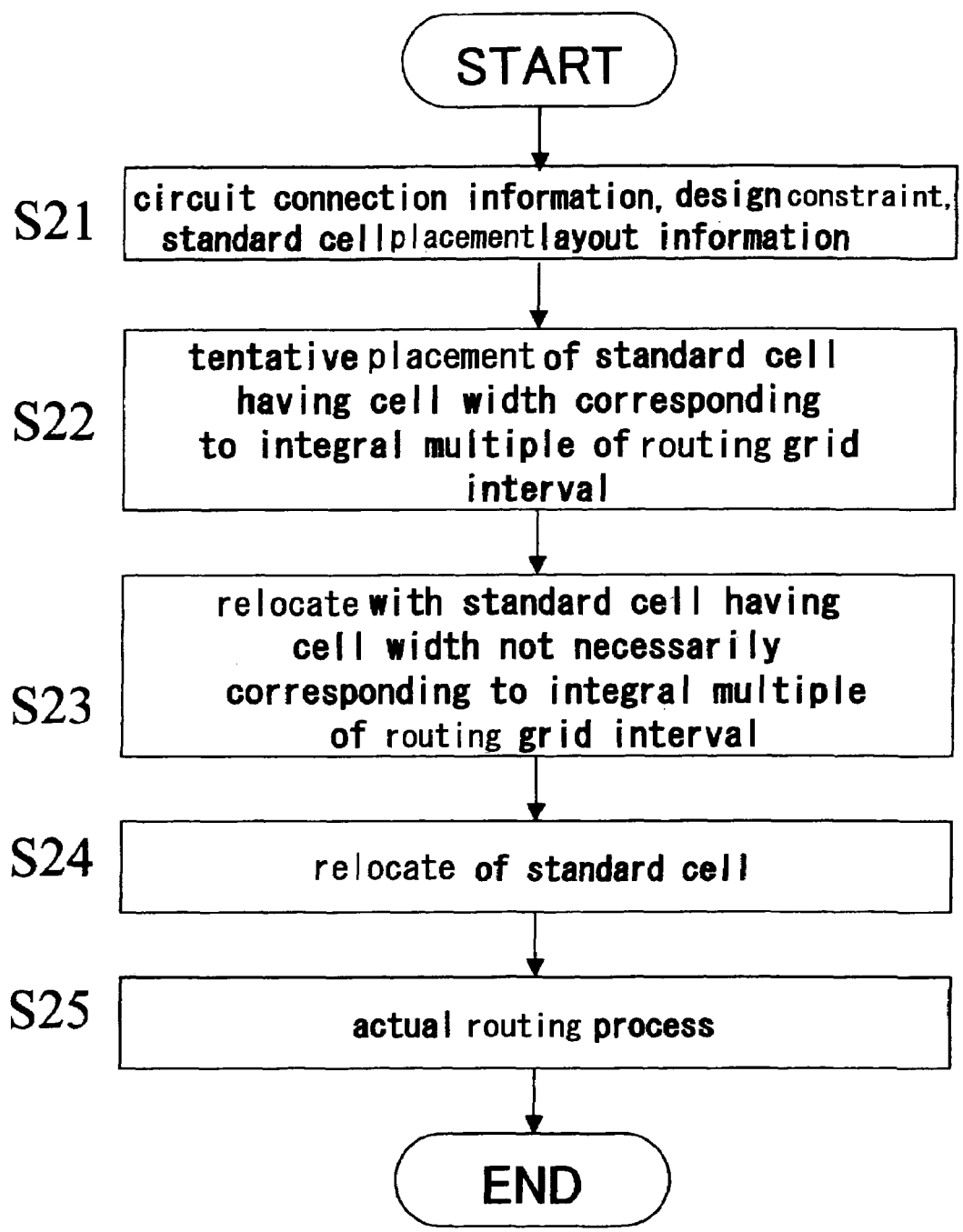
FIG. 9 is a design flow chart of an automatic placement & routing method using a standard cell according to an embodiment 4 of the present invention.

FIG. 9 is a design flow chart of an automatic placement & routing method using a standard cell according to an embodiment 4 of the present invention.

An automatic placement & routing apparatus for implementing the automatic placement & routing method comprises a connection information inputting device for acquiring a connection information of a logic circuit from outside, a design constraint inputting device for acquiring a design constraint of the logic circuit from outside, a layout information inputting device for acquiring a layout information of a standard cell library including cells having a cell width corresponding to the integral multiple of the routing grid interval and a layout information of a standard cell library including cells having a cell width not necessarily corresponding to the integral multiple of the routing grid interval from outside, a placing device for placing the cells of the standard cell library having the cell width corresponding to the integral multiple of the routing grid interval based on the acquired connection information, a cell replacing device for replacing the placed cells with the cells of the same logic in the standard cell library having the width not necessarily corresponding to the integral multiple of the routing grid interval, a relocating device for relocating the cells in order to reduce an area where the cells are located, and an actual routing processing device for connecting the relocated cells by wirings based on the connection information.

The group of standard cells having the cell width corresponding to the integral multiple of the routing grid interval is referred to as a first group of cells, and the group of standard cells having the cell width not necessarily corresponding to the integral multiple of the routing grid interval is referred to as a second group of cells.

First, the circuit connection information of the logic circuit for connecting the plurality of standard cells to one another, the design constraint required for the automatic placement & routing, and the layout data of the respective standard cells are previously stored in the memory device not shown. The layout information stored in the memory device basically has a structure similar to the layout information of the cells, C11, C12 and C13 having the structure described in the embodiment 1. However, the layout information includes the layout information of the first group of cells and the layout information of the second group of cells.

Based on the foregoing arrangement, the automatic placement & routing apparatus reads the circuit connection information of the logic circuit for connecting the plurality of standard cells to one another, the design constraint required for the automatic placement & routing, and the layout data of the first group of cells and the layout data of the second group of cells from the memory device in a data reading step S21.

Next, the automatic placement & routing apparatus places first cells Cb11, Cb12 and Cb13 whose layout information have been read out so that origins thereof Ob11, ob12 and Ob13 are located at the midpoints between the adjacent routing grids in the X direction and at the midpoints between the adjacent routing grids in the Y direction based on the circuit connection information as shown in FIG. 10 in a tentative placing step S22.

Next, the automatic placement & routing apparatus replaces the first cells Cb11, Cb12 and CB13 with second cells Cb21, Cb22 and Cb23 based on the same logic in a cell replacing step S23. In the replacement, origins Ob21, Ob22 and Ob23 of the second cells Cb21, Cb22 and Cb23 are set to have the same coordinates as the origins Ob11, Ob12 and Ob13 of the cells Cb11, Cb12 and Cb13.

Next, the automatic placement & routing apparatus relocates the second cells Cb21, Cb22 and Cb23 by shifting them in the X direction so that a total area where the cells are located is reduced in a relocating step S24. The cells are shifted maximally to a point at which the cell boundaries of the adjacent cells are in contact with each other.

Thereafter, the automatic placement & routing apparatus routes the relocated second cells Cb21, Cb22 and Cb23 with respect to one another based on the connection information in an actual routing processing step S25.

According to the foregoing design flow, the regions Rb21 and Rb22 (shaded parts) shown in FIG. 10 can be eliminated when the automatic placement & routing tool incapable of directly handling the second cells having the cell width not necessarily corresponding to the integral multiple of the routing grid interval is used. As a result, the logic area comprising the standard cells can be reduced, and the chip area is consequently reduced.

EMBODIMENT 5

Figure 11:
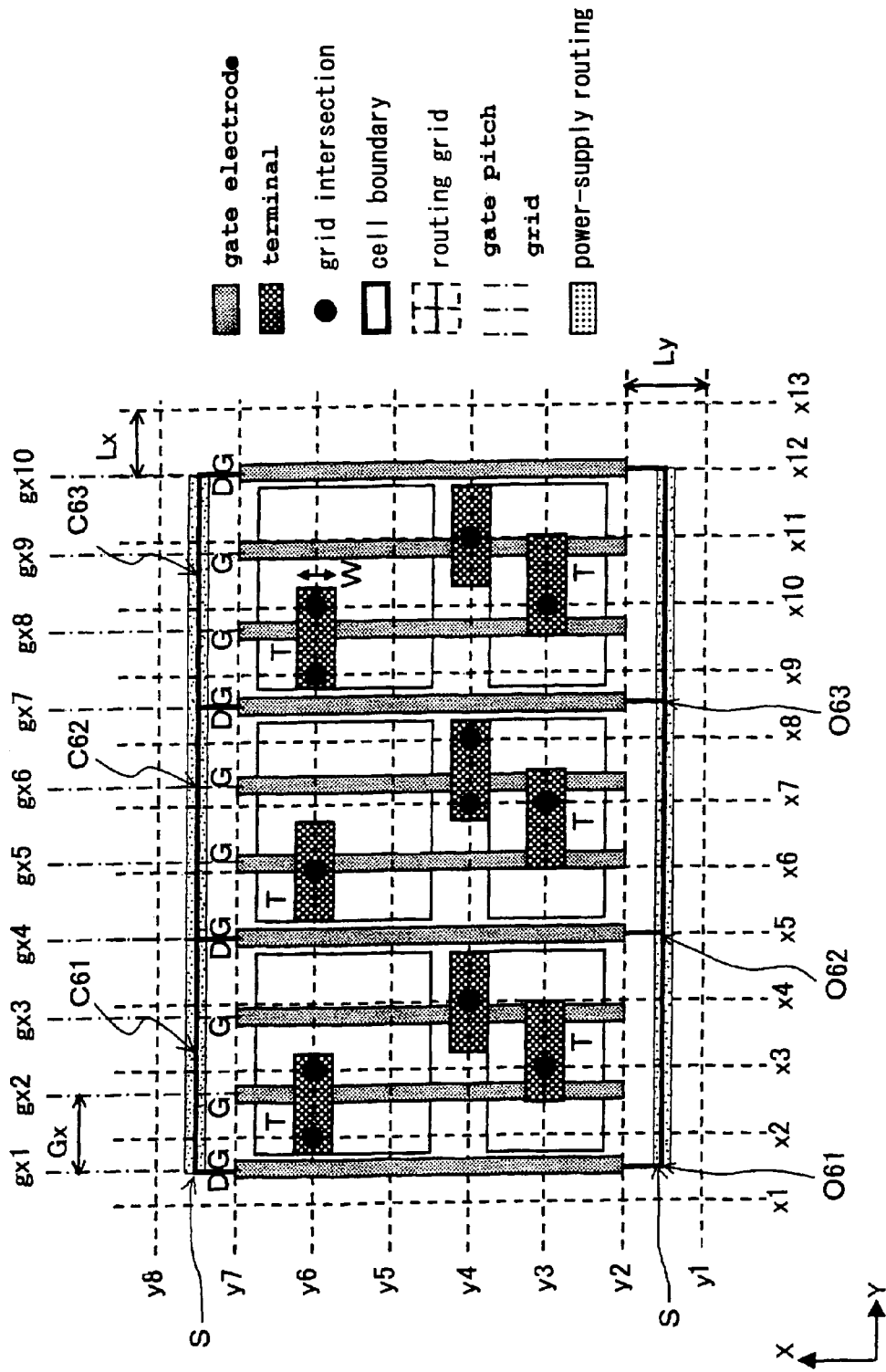
FIG. 11 is a layout of standard cells according to an embodiment 5 of the present invention.

FIG. 11 is a layout of standard cells according to an embodiment 5 of the present invention. A direction along a power-supply wiring S of the standard cell is referred to as X direction, while a direction vertical to the power-supply wiring S is referred to as Y direction. The power-supply wiring S is merely an example, and is not necessarily allocated as shown.

Referring to reference symbols in FIG. 11, x1-x13 denote routing grids for the automatic placement & routing disposed in parallel with the Y direction and adjacent to one another in the X direction, y1-y8 denote routing grids disposed in parallel with the X direction and adjacent to one another in the Y direction, gx1-gx10 denote grids of gate pitches for the automatic placement & routing disposed in parallel with the Y direction and adjacent to one another in the X direction, C61, C62 and C63 are standard cells, O61, O62 and O63 are respective origins of the standard cells C61, C62 and C63, T denotes a terminal capable of transmitting an input signal or an output signal of the standard cell Ci (i=1, 2, . . . ), G denotes a gate electrode, and DG denotes a dummy gate electrode.

In the standard cells C61, C62 and C63, gate lengths and gate intervals of the gate electrode G and dummy gate electrode DG are constant, and a cell width of the standard cells C61, C62 and C63 in the X direction is an integral multiple of a minimum value of a gate pitch Gx (value of gate pitch=gate length+gate interval) (In FIG. 11, the cell width of the standard cells C61, C62 and C63 is three times as wide as Gx).

An automatic placement & routing tool is an automatic design tool for determining the location of cells and blocks and routing path among their terminals. The automatic placement & routing tool is constituted in the same manner as in the respective embodiments described earlier.

In the placement using the automatic placement & routing tool, the respective cells can be located at the positions of the grids of the gate pitches in the X direction because the cell width of each cell in the X direction is the integral multiple of the gate pitch Gx.

The use of the automatic 1 placement & routing tool allows the wiring to be provided on the routing grids in the X and Y directions with a minimum wiring width. The routing grids are located at the equal interval of Lx different to the gate pitch Gx in the X direction, and located at the equal interval of Ly in the Y direction. Basically, different wiring layers are used for the wirings in the X direction and the wirings in the Y direction, and the different wiring layers are joined by means of the inter-layer connection.

A wiring constituting the terminal T has a rectangular shape horizontally extended along the X direction. A shorter-side dimension of the terminal T corresponds to a wiring width W in the automatic placement & routing. A longer-side dimension is at least (Lx+W).

In order to provide the wiring connection for the terminal T using the automatic placement & routing tool, the terminal T must include the grid intersection (a point at which the routing grids intersect with each other) (see black circles ●). In the embodiment 5, the terminal T has the rectangular shape horizontally extended (extended in the X direction) and is located on the routing grid yi (i=1, 2, . . . ) along the Y direction.

On the contrary to the constitution according to the embodiment 5, when the wiring constituting the terminal T has the rectangular shape vertically extended in the Y direction (extended in the Y direction) as shown in FIG. 13, some of the terminals T do not locate on the grid intersection as shown by the terminals encircled by an ellipse. This is identical to the disadvantage of the conventional technology shown in FIG. 17.

Figure 12:
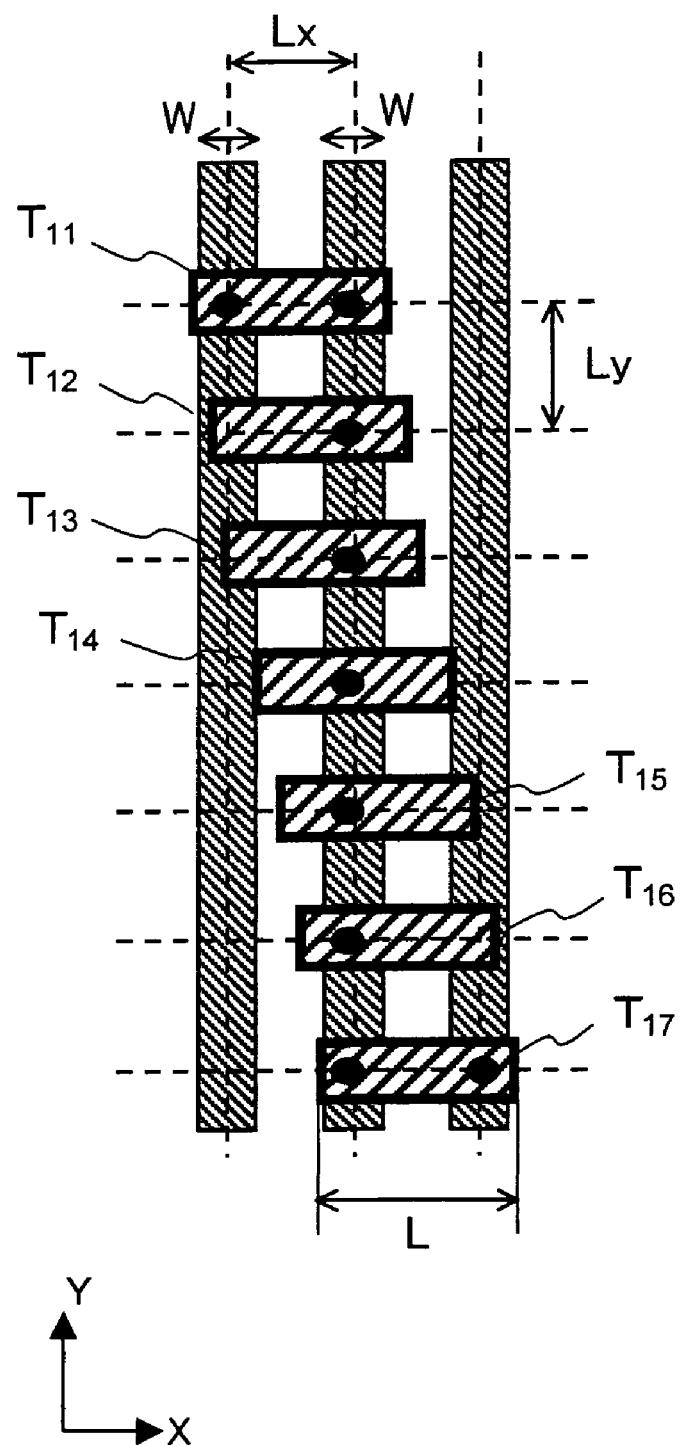
FIG. 12 is an illustration of locations of terminals according to the embodiment 5.

When the terminal T has the rectangular shape horizontally extended wherein its longer-side dimension is (Lx+W) as in the embodiment 5, the terminal T intersects with the intersection of the routing grids maximally at two positions as exemplified by terminals $T_{11}$ and $T_{17}$ shown in FIG. 12. Further, the terminal T intersects with at least one grid intersection point as exemplified by terminals $T_{12}$-$T_{16}$ even when the terminal T shifts in the X direction from the positions shown by the terminals $T_{11}$ and $T_{17}$.

According to the embodiment 5, the terminal T can be located at not less than one routing grid intersection even when the cells are located at an integral multiple of the gate pitch Gx different to the routing grid Lx in the X direction though the location of the cells is restricted in the Y direction. Therefore, it becomes unnecessary to locate the cell origins at the inter-grid mid points in the X direction as shown by the cells C51, C52 and C53 according to the conventional technology of FIG. 17 in order to locate all of the terminals T on the routing grids. In other words, the extra regions R1, R2 and R3 for locating all of the terminals T on the routing grids need not be provided in the cell, or the useless regions R1, R2 and R3 are no longer generated between the cells. As a result, the chip area can be reduced.

Not only inside the respective standard cells C61, C62 and C63, but also among the standard cells C61, C62 and C63 to one another, the gate lengths and the gate intervals are equal in the patterns of the gate electrodes and the dummy gate electrodes. Accordingly, a precision in a finished dimension of the gate electrode can be improved. Further, when the standard cells are adjacently located, the gate lengths and the gate intervals in the patterns of the gate electrodes and the dummy gate electrodes are the same as when they are located alone.

An upper-limit value of the longer-side dimension of the wiring constituting the terminal T is substantively a length obtained by subtracting the minimum wiring interval from the cell width of the Cell C along the X direction. Further, as described, the longer-side dimension of the wiring constituting the terminal T is preferably (Lx+W) in terms of the area efficiency. However, the value of (Lx+W) may be regarded as the lower-limit value of the longer-side dimension of the wiring constituting the terminal T.

In the embodiment 5 described above, the present invention was applied to the standard cell when logic blocks are synthesized in the design. However, the present invention can also be applied to a gate array cell whose gate pitch is previously set according to the embodiment 5. In that case, the terminal of the gate array cell should have the shape identical to that of the terminal of the standard cell. Then, the effect of reducing the cell area is obtained in the same manner as in the case of the standard cell. Alternatively, the block area can be prevented from increasing when the routing grids are extended to be equal to the gate pitch of the gate array cell.

Figure 14:
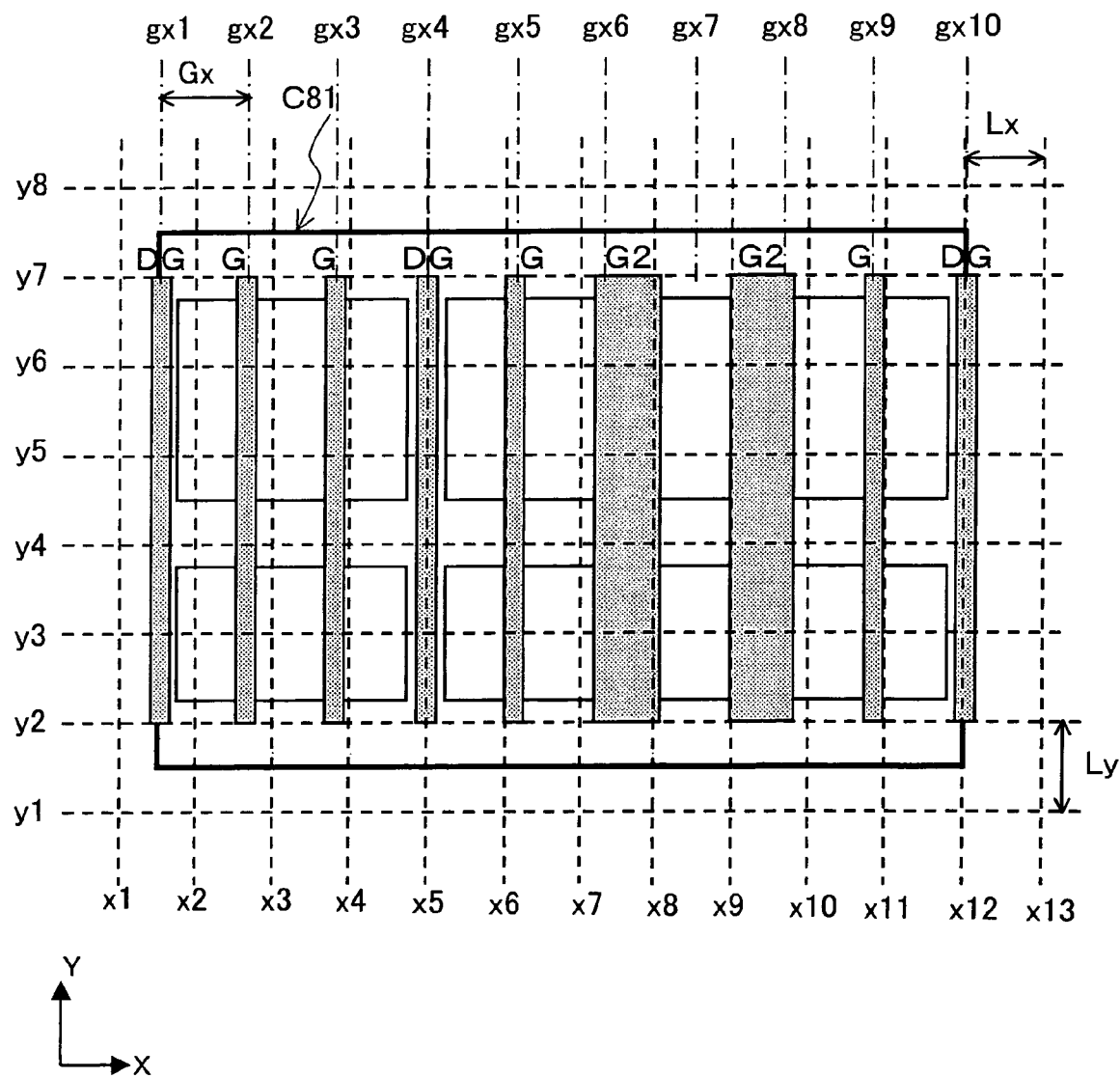
FIG. 14 is a layout of a standard cell including gate electrodes having different gate lengths in the embodiment 5.

In the embodiment 5, the gate lengths are all equal in the gate electrodes and the dummy gate electrodes, however, are not necessarily be equal. FIG. 14 shows an example of a standard cell in which the gate lengths in part of the gate electrodes and the dummy gate electrodes are not equal.

In FIG. 14, a reference symbol C81 denotes a standard cell. The standard cell C81 comprises gate electrodes G, dummy gate electrodes DG and two gate electrodes G2 having a gate length different to those of the gate electrode G and the dummy gate electrode DG, wherein a width of the gate electrode G2 is set so that a cell width of the standard cell C81 in the X direction is an integral multiple of the gate pitch Gx. In FIG. 14, the cell width of the standard cell C81 is nine times as wide as the gate pitch Gx. The width of the gate electrode G2 is thus set because a processing speed is expected to be faster when the cell width of each cell in the X direction is the integral multiple of the gate pitch Gx than when the cell width of each cell takes an arbitrary value in the placement using the conventional automatic placement & routing tool. However, the width of the gate electrode G2 is not necessarily set in the foregoing manner. The terminals are not shown in FIG. 14 to simplify the description.

As described, in the case of including the standard cell comprising the gate electrodes having the different gate lengths, when the terminal has the rectangular shape horizontally extended wherein longer-side dimension is (Lx+W) so that the terminal intersects with at least one routing grid intersection point, the cell position in the X direction can be arbitrarily set, which prevents the generation of any additional region between the cells.

Further, when the cell width of each cell in the X direction is set to the integral multiple of the gate pitch Gx in terms of the processing speed of the automatic placement & routing, any additional region is not generated between the cells as in the foregoing case. As another advantage, the degree of freedom in designing the standard cell is improved because the patterns of the gate electrode and the dummy gate electrode can include the uneven part in the gate length and gate interval.

Further, the effect of processing the OPC in each standard cell is the same as in the other embodiments.

The above description referred to the constitution where the gate electrodes having the different gate lengths are provided. However, the embodiment 5 can be applied in the same manner to a cell structure where the dummy gate electrodes having the different gate lengths are provided and a cell structure where the gate electrodes and the dummy gate electrodes having the different gate intervals are provided.

The description of the embodiment 5 is premised on the provision of the dummy gates DG, however, the same effect can be obtained in the same manner when the embodiment 5 is applied to a constitution where the dummy gate electrodes DG are not provided and the distance from the cell boundary of each standard cell to the gate electrode in the closest vicinity is constant.

In the constitution, the distance from the cell boundary of each standard cell to the gate electrode in the closest vicinity and the distance from the cell boundary of another standard cell adjacent thereto to the gate electrode in the closest vicinity are constant. Therefore, the effect obtained in the embodiment 5, that is the OPC can be processed in each standard cell, can be realized in the same manner in the foregoing constitution.

For example, a distance from each of the cell boundary of the standard cells C61, C62 and C63 to the gate electrode in the X direction is "Gx−gate length/2" and constant even in the constitution shown in FIG. 11 where the dummy gate electrodes DG are not provided. A distance between a transistor disposed at the end of each standard cell and the gate electrode G of the adjacent standard cell is "2Gx−gate length" and constant. For example, even in the case where the dummy gate electrode DG is not provided in the constitution described referring to FIG. 11, the distance from each of the cell boundary of the respective standard cells C61, C62 and C63 to the gate electrode G located at the end of each of the standard cells in the X direction is constant at (Gx−gate length/2). Further, the distance from the gate electrode G located at the end of each of the standard cells to the gate electrode G located at the end of each of adjacent standard cells in the X direction is constant at (2Gx−gate length).

EMBODIMENT 6

Figure 15:
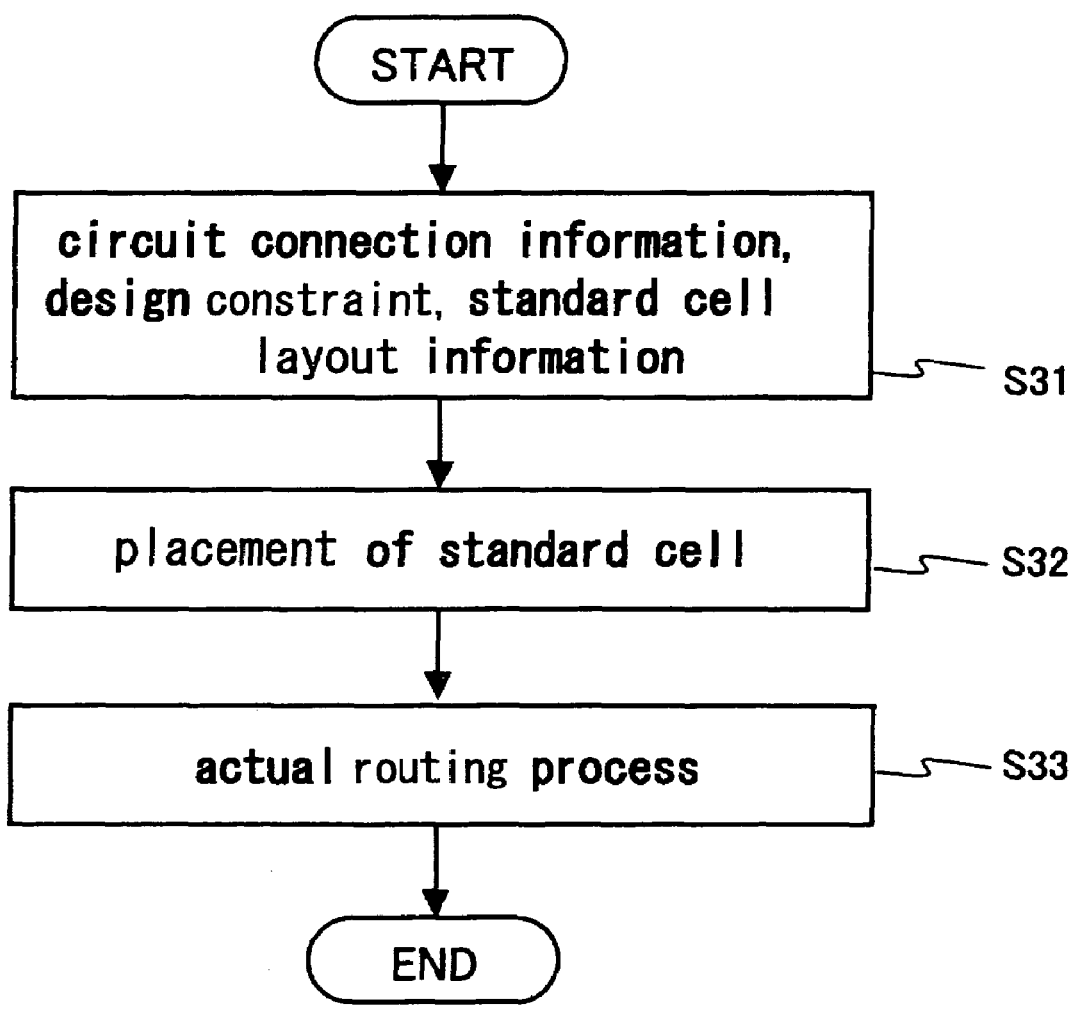
FIG. 15 is a design flow chart of an automatic placement & routing method using a standard cell according to an embodiment 6 of the present invention.

FIG. 15 is a design flow chart of an automatic placement & routing method for a standard cell according to an embodiment 6 of the present invention.

An automatic placement & routing apparatus for implementing the automatic placement & routing method comprises a connection information inputting device for acquiring a connection information of a logic circuit from outside, a design constraint inputting device, a layout information inputting device for acquiring a layout information of a standard cell, and a placing device for placing cells based on the acquired connection information. The automatic placement & routing apparatus thus constituted places and routes the logic circuit including a plurality of standard cells.

First, the circuit connection information of the logic circuit for connecting the plurality of standard cells to one another, the design constraint required for the automatic placement & routing, and the layout data of the respective standard cells are previously stored in the memory device not shown. The layout information stored in the memory device refers to the layout of the cells, C21, C22 and C23 having the structure described in the embodiment 5.

Based on the foregoing arrangement, the automatic placement & routing apparatus reads the circuit connection information of the logic circuit, design constraint and layout data of the respective standard cells from the memory device in a data reading step S31.

Figure 16:
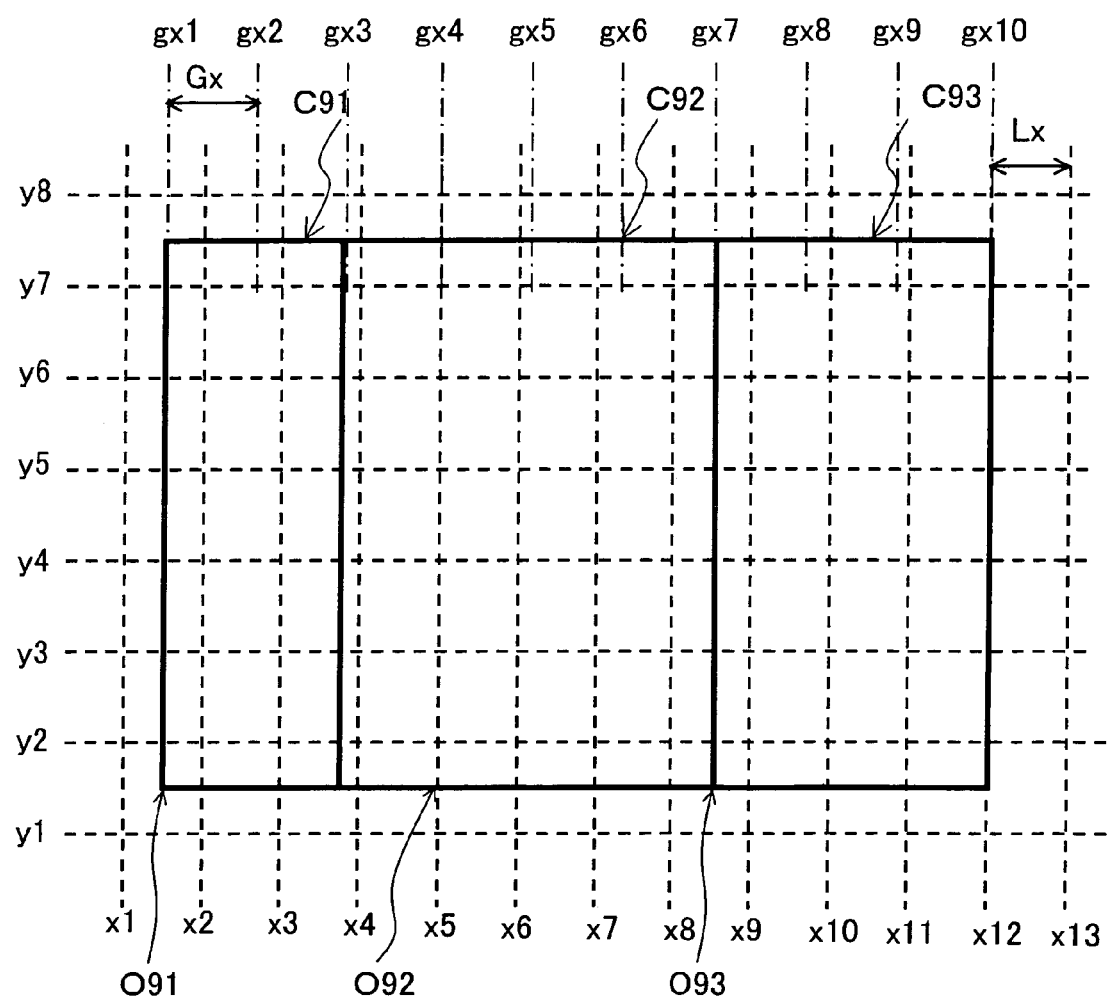
FIG. 16 is a layout of standard cells according to the embodiment 6.
Figure 16:
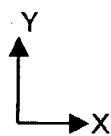

Next, the automatic placement & routing apparatus places cells C91, C92 and C93 based on the circuit connection information in a placing step S32. The cells C91, C92 and C93 are located at the grid positions corresponding to the integral multiple of the gate pitch Gx that regulates the cell width in the X direction and at the midpoints between the adjacent routing grids in the Y direction as shown in FIG. 16.

Thereafter, the automatic placement & routing apparatus routes the placed cells C91, C92 and C93 with respect to one another in an actual routing processing step S33.

In the embodiment 6, the cells are located at the grid positions corresponding to the integral multiple of the gate pitch Gx that regulates the cell width in the X direction in the cell placement step S32 so that the cell area can be reduced and the chip size is consequently reduced.

Further, in the embodiment 6, the standard cells described in the embodiments 1 and 5 are used. The gate lengths and the gate intervals are thereby equal in the patterns of the gate electrodes of the placed standard cells C91, C92 and C93, which leads to the improvement of the precision in the finished dimension of the gate electrodes. The improvement of the precision in the finished dimension of the gate electrodes can be realized not only inside each of the standard cells C91, C92 and C93 but also between the standard cells.

Further, when the standard cells are adjacently located, the gate lengths and the gate intervals in the patterns of the gate electrodes and the dummy gate electrodes are the same as when they are located alone. Therefore, the OPC can be processed in each standard cell.

An automatic placement & routing method for the standard cell shown in the embodiment 6 can realize the data reading step S21, placing step S22, actual routing processing step S23 and the like by executing an operation process using a CPU or the like. Then, a designer can input the design constraint and the like to the memory device using a keyboard or the like so that the design constraint is memorized therein, and further, confirm data during the designing process and data after the completion of the routing process via a monitor screen in the designing process. Thus, the present embodiment can be realized on hardware.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A cell comprising a plurality of terminals capable of transmitting an input signal or an output signal and serving as a minimum unit in designing a semiconductor integrated circuit, wherein the plurality of terminals is placed on routing grids lined in a Y direction which is a direction vertical to a power-supply wiring of the cell used in automatic placement and routing and has a shape extended along an X direction which is a direction in parallel with the power-supply wiring, and a shorter-side dimension of the terminal corresponds to a wiring width in the automatic placement and routing, and a longer-side dimension of the terminal is at least a routing grid interval along the X direction and at most a length obtained by subtracting a minimum wiring interval from a cell width of the cell along the X direction.

2. A cell as claimed in claim 1, wherein the cell is a standard cell.

3. A cell as claimed in claim 1, wherein the cell is a gate array cell.

4. A semiconductor integrated circuit comprising the cell as claimed in claim 1 and a circuit substrate on which the cell is mounted.

5. A cell comprising a plurality of terminals capable of transmitting an input signal or an output signal and serving as a minimum unit in designing a semiconductor integrated circuit, wherein the plurality of terminals is placed on routing grids lined in a Y direction which is a direction vertical to a power-supply wiring of the cell used in automatic placement and routing and has a shape extended along an X direction which is a direction in parallel with the power-supply wiring, and a shorter-side dimension of the terminal corresponds to a wiring width in the automatic placement and routing, and a longer-side dimension of the terminal is at least "a routing grid interval along the X direction+the wiring width" and at most a length obtained by subtracting a minimum wiring interval from a cell width of the cell along the X direction.

6. A cell as claimed in claim 5, wherein the cell is a standard cell.

7. A cell as claimed in claim 5, wherein the cell is a gate array cell.

8. A semiconductor integrated circuit comprising the cell as claimed in claim 5 and a circuit substrate on which the cell is mounted.

9. A cell comprising a plurality of terminals capable of transmitting an input signal or an output signal and serving as a minimum unit in designing a semiconductor integrated circuit, wherein
the plurality of terminals is placed on routing grids lined in a Y direction which is a direction vertical to a power-supply wiring of the cell used in automatic placement and routing and has a shape extended along an X direction which is a direction in parallel with the power-supply wiring, and
a shorter-side dimension of the terminal corresponds to a wiring width in the automatic placement and routing, and a longer-side dimension of the terminal is equal to "a routing grid interval along the X direction+the wiring width".

10. A cell as claimed in claim 9, wherein the cell is a standard cell.

11. A cell as claimed in claim 9 wherein the cell is a gate array cell.

12. A semiconductor integrated circuit comprising the cell as claimed in claim 9 and a circuit substrate on which the cell is mounted.

13. A cell comprising a plurality of terminals capable of transmitting an input signal or an output signal and serving as a minimum unit in designing a semiconductor integrated circuit, wherein
the plurality of terminals is placed on routing grids lined in a Y direction which is a direction vertical to a power-supply wiring of the cell used in automatic placement and routing and has a shape extended along an X direction which is a direction in parallel with the power-supply wiring, and
a shorter-side dimension of the terminal corresponds to a wiring width in the automatic placement and routing, and a longer-side dimension of the terminal is equal to a length obtained by subtracting a minimum wiring interval from a cell width of the cell along the X direction.

14. A cell as claimed in claim 13, wherein the cell is a standard cell.

15. A cell as claimed in claim 13, wherein the cell is a gate array cell.

16. A semiconductor integrated circuit comprising the cell as claimed in claim 13 and a circuit substrate on which the cell is mounted.

17. A cell comprising a plurality of terminals capable of transmitting an input signal or an output signal and serving as a minimum unit in designing a semiconductor integrated circuit, wherein
the plurality of terminals is placed on routing grids lined in a Y direction which is a direction vertical to a power-supply wiring of the cell used in automatic placement and routing and has a shape extended along an X direction which is a direction in parallel with the power-supply wiring,
a shorter-side dimension of the terminal corresponds to a wiring width in the automatic placement and routing, and a longer-side dimension of the terminal is at least a routing grid interval along the X direction and at most a length obtained by subtracting a minimum wiring interval from a cell width of the cell along the X direction, and
a width of the cell along the X direction in parallel with the power-supply wiring of the cell is an integral multiple of a numeral value different to a routing grid interval along the X direction.

18. A cell comprising a plurality of terminals capable of transmitting an input signal or an output signal and serving as a minimum unit in designing a semiconductor integrated circuit, wherein
the plurality of terminals is placed on routing grids lined in a Y direction which is a direction vertical to a power-supply wiring of the cell used in automatic placement and routing and has a shape extended along an X direction which is a direction in parallel with the power-supply wiring,
a shorter-side dimension of the terminal corresponds to a wiring width in the automatic placement and routing, and a longer-side dimension of the terminal is at least "a routing grid interval along the X direction+the wiring width" and at most a length obtained by subtracting a minimum wiring interval from a cell width of the cell along the X direction, and
a width of the cell along the X direction in parallel with the power-supply wiring of the cell is an integral multiple of a numeral value different to the routing grid interval along the X direction.

19. A cell comprising a plurality of terminals capable of transmitting an input signal or an output signal and serving as a minimum unit in designing a semiconductor integrated circuit, wherein
the plurality of terminals is placed on routing grids lined in a Y direction which is a direction vertical to a power-supply wiring of the cell used in automatic placement and routing and has a shape extended along an X direction which is a direction in parallel with the power-supply wiring,
a shorter-side dimension of the terminal corresponds to a wiring width in the automatic placement and routing, and a longer-side dimension of the terminal is equal to "a routing grid interval along the X direction+the wiring width", and
a width of the cell along the X direction in parallel with the power-supply wiring of the cell is an integral multiple of a numeral value different to the routing grid interval along the X direction.

20. A cell comprising a plurality of terminals capable of transmitting an input signal or an output signal and serving as a minimum unit in designing a semiconductor integrated circuit, wherein
the plurality of terminals is placed on routing grids lined in a Y direction which is a direction vertical to a power-supply wiring of the cell used in automatic placement and routing and has a shape extended along an X direction which is a direction in parallel with the power-supply wiring,
a shorter-side dimension of the terminal corresponds to a wiring width in the automatic placement and routing, and a longer-side dimension of the terminal is equal to a length obtained by subtracting a minimum wiring interval from a cell width of the cell along the X direction, and said width of the cell along the X direction in parallel with the power-supply wiring of the cell is an integral multiple of a numeral value different to a routing grid interval along the X direction.

21. A standard cell comprising a plurality of gate electrodes, wherein
gate pitches of some of the gate electrodes are set to values different to the routing grid interval set along an X direction in parallel with a power-supply wiring of the standard cell, and
a cell width along the X direction in parallel with the power-supply wiring of the standard cell is set to an integral multiple of a minimum value of the gate pitches of the gate electrodes set to the values different to the routing grid interval set along the X direction,
said standard cell further comprising a plurality of terminals capable of transmitting an input signal or an output signal, wherein
the terminals are located on routing grids along a Y direction vertical to the power-supply wiring of the cell used in automatic placement and routing and each has a shape extended in the X direction in parallel with the power-supply wiring, and
a shorter-side dimension of the terminal corresponds to a wiring width in the automatic placement and routing, and a longer-side dimension of the terminal is at least the routing grid interval along the X direction and at most a length obtained by subtracting a minimum wiring interval from the cell width of the standard cell along the X direction.

22. A standard cell library including the standard cell as claimed in claim 21.

23. A semiconductor integrated circuit comprising the standard cell as claimed in claim 21 and a circuit substrate on which the standard cell is mounted.

24. A standard cell comprising a plurality of gate electrodes, wherein
gate pitches of some of the gate electrodes are set to values different to the routing grid interval set along an X direction in parallel with a power-supply wiring of the standard cell, and
a cell width along the X direction in parallel with the power-supply wiring of the standard cell is set to an integral multiple of a minimum value of the gate pitches of the gate electrodes set to the values different to the routing grid interval set along the X direction,
said standard cell further comprising a plurality of terminals capable of transmitting an input signal or an output signal, wherein
the terminals are located on routing grids along a Y direction vertical to the power-supply wiring of the cell used in automatic placement and routing and each has a shape extended in the X direction in parallel with the power-supply wiring, and
a shorter-side dimension of the terminal corresponds to a wiring width in the automatic placement and routing, and a longer-side dimension of the terminal is at least "the routing grid interval along the X direction+the wiring width" and at most a length obtained by subtracting a minimum wiring interval from the cell width of the standard cell along the X direction.

25. A standard cell library including the standard cell as claimed in claim 24.

26. A semiconductor integrated circuit comprising the standard cell as claimed in claim 24 and a circuit substrate on which the standard cell is mounted.

27. A standard cell comprising a plurality of gate electrodes, wherein
gate pitches of some of the gate electrodes are set to values different to the routing grid interval set along an X direction in parallel with a power-supply wiring of the standard cell, and
a cell width along the X direction in parallel with the power-supply wiring of the standard cell is set to an integral multiple of a minimum value of the gate pitches of the gate electrodes set to the values different to the routing grid interval set along the X direction,
said standard cell further comprising a plurality of terminals capable of transmitting an input signal or an output signal, wherein
the terminals are located on routing grids along a Y direction vertical to the power-supply wiring of the cell used in automatic placement and routing and each has a shape extended in the X direction in parallel with the power-supply wiring, and
a shorter-side dimension of the terminal corresponds to a wiring width in the automatic placement and routing, and a longer-side dimension of the terminal is equal to "the routing grid interval along the X direction+the wiring width".

28. A standard cell library including the standard cell as claimed in claim 27.

29. A semiconductor integrated circuit comprising the standard cell as claimed in claim 27 and a circuit substrate on which the standard cell is mounted.

30. A standard cell comprising a plurality of gate electrodes, wherein
gate pitches of some of the gate electrodes are set to values different to the routing grid interval set along an X direction in parallel with a power-supply wiring of the standard cell, and
a cell width along the X direction in parallel with the power-supply wiring of the standard cell is set to an integral multiple of a minimum value of the gate pitches of the gate electrodes set to the values different to the routing grid interval set along the X direction,
said standard cell further comprising a plurality of terminals capable of transmitting an input signal or an output signal, wherein
the terminals are located on routing grids along a Y direction vertical to the power-supply wiring of the cell used in automatic placement and routing and each has a shape extended in the X direction in parallel with the power-supply wiring, and
a shorter-side dimension of the terminal corresponds to a wiring width in the automatic placement and routing, and a longer-side dimension of the terminal is equal to a length obtained by subtracting a minimum wiring interval from the cell width of the standard cell along the X direction.

31. A standard cell library including the standard cell as claimed in claim 30.

32. A semiconductor integrated circuit comprising the standard cell as claimed in claim 30 and a circuit substrate on which the standard cell is mounted.

* * * * *